United States Patent
Qiu et al.

(10) Patent No.: US 10,312,453 B2
(45) Date of Patent: Jun. 4, 2019

(54) ORGANIC ELECTROLUMINESCENT DEVICE AND METHOD FOR MANUFACTURE THEREOF

(71) Applicants: BEIJING VISIONOX TECHNOLOGY CO., LTD., Beijing (CN); TSINGHUA UNIVERSITY, Beijing (CN)

(72) Inventors: Yong Qiu, Beijing (CN); Lian Duan, Beijing (CN); Dongdong Zhang, Beijing (CN); Guohui Zhang, Beijing (CN)

(73) Assignees: BEIJING VISIONOX TECHNOLOGY CO., LTD., Beijing (CN); TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 15/106,209

(22) PCT Filed: Dec. 16, 2014

(86) PCT No.: PCT/CN2014/093904
§ 371 (c)(1),
(2) Date: Jun. 17, 2016

(87) PCT Pub. No.: WO2015/090177
PCT Pub. Date: Jun. 25, 2015

(65) Prior Publication Data
US 2016/0322582 A1     Nov. 3, 2016

(30) Foreign Application Priority Data
Dec. 17, 2013   (CN) .......................... 2013 1 0692266

(51) Int. Cl.
*H01L 51/00* (2006.01)
*H01L 51/50* (2006.01)
(Continued)

(52) U.S. Cl.
CPC ........ *H01L 51/0067* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS

2012/0248968 A1* 10/2012 Ogiwara ............. H01L 51/5012
                                                                    313/504
2012/0273767 A1    11/2012 Yokoyama et al.
(Continued)

FOREIGN PATENT DOCUMENTS

CN    101993440 A    3/2011
CN    103443949 A    12/2013
(Continued)

OTHER PUBLICATIONS

KR Notice of Allowance dated Nov. 30, 2018 in application No. 10-2016-7018945.

*Primary Examiner* — Jack S Chen
(74) *Attorney, Agent, or Firm* — Maschoff Brennan

(57) ABSTRACT

The present invention discloses an organic electroluminescent device and a manufacturing method thereof. The host material of the light-emitting layer of the organic electroluminescent device is material in which the triplet state energy level of the CT excited state is higher than that of the n-π excited state by 0 to 0.3 eV; or the triplet state of the host material of the light-emitting layer is higher than that of the n-π excited state by more than 1.0 eV; in addition, the difference in energy level between the second triplet state of the n-π state and the first singlet state of the CT excited state is −0.1 to 0.1 eV; and the luminescent dye is a fluorescent dye. With regard to the organic electroluminescent device in the present invention, as new host material in the light-
(Continued)

emitting layer is used and the host material has a donor group and an acceptor group, the triplet state in the light-emitting layer may be fully utilized to achieve a 100% light-emitting efficiency in the fluorescent device. Furthermore, no noble metal is required to be used, thus reducing the cost.

11 Claims, 2 Drawing Sheets

(51) Int. Cl.
*C09K 11/02* (2006.01)
*C09K 11/06* (2006.01)
*H01L 51/56* (2006.01)

(52) U.S. Cl.
CPC .......... *H01L 51/006* (2013.01); *H01L 51/007* (2013.01); *H01L 51/0051* (2013.01); *H01L 51/0054* (2013.01); *H01L 51/0061* (2013.01); *H01L 51/0065* (2013.01); *H01L 51/0071* (2013.01); *H01L 51/0072* (2013.01); *H01L 51/5012* (2013.01); *C09K 2211/1007* (2013.01); *C09K 2211/1011* (2013.01); *C09K 2211/1029* (2013.01); *C09K 2211/1088* (2013.01); *H01L 51/0056* (2013.01); *H01L 51/0068* (2013.01); *H01L 51/5016* (2013.01); *H01L 51/5056* (2013.01); *H01L 51/5072* (2013.01); *H01L 51/56* (2013.01); *H01L 2051/0063* (2013.01); *H01L 2251/55* (2013.01)

(56) References Cited

U.S. PATENT DOCUMENTS

| | | |
|---|---|---|
| 2012/0286251 A1 | 11/2012 | Park et al. |
| 2012/0330025 A1 | 12/2012 | Osaka et al. |
| 2013/0305963 A1 | 11/2013 | Fridman |
| 2014/0001449 A1 | 1/2014 | Maunoury et al. |
| 2014/0159023 A1 | 6/2014 | Matsumoto et al. |
| 2014/0326987 A1 | 11/2014 | Park et al. |
| 2015/0090977 A1 | 4/2015 | Imai et al. |
| 2016/0190478 A1 | 6/2016 | Nakanotani et al. |
| 2016/0197287 A1 | 7/2016 | Kawamura et al. |

FOREIGN PATENT DOCUMENTS

| | | |
|---|---|---|
| EP | 2980877 A1 | 2/2016 |
| EP | 3035401 A1 | 6/2016 |
| JP | 2007-027620 A | 2/2007 |
| JP | 2008533674 A | 8/2008 |
| JP | 2011-026289 A | 2/2011 |
| JP | 2012089513 A | 5/2012 |
| JP | 2012193352 A | 10/2012 |
| JP | 2013-12694 A | 1/2013 |
| JP | 2013-028597 A | 2/2013 |
| TW | 201218477 A1 | 5/2012 |
| TW | 201229040 A1 | 7/2012 |
| TW | 201247597 A1 | 12/2012 |
| TW | 201331211 A1 | 8/2013 |
| TW | 201349618 A1 | 12/2013 |
| WO | 2011/048821 A1 | 4/2011 |
| WO | 2012/133188 A1 | 10/2012 |
| WO | 2012/157211 A1 | 11/2012 |
| WO | 2012153083 A | 11/2012 |
| WO | 2014/157619 A1 | 10/2014 |

* cited by examiner

ORGANIC ELECTROLUMINESCENT DEVICE AND METHOD FOR MANUFACTURE THEREOF

TECHNICAL FIELD

The present invention relates to the field of electroluminescent devices, and in particular, relates to an electroluminescent device and a manufacturing method thereof.

BACKGROUND

When electro-excited, an organic electroluminescent device will generate 25% of singlet state and 75% of triplet state. Because of being spin-forbidden, traditional fluorescent material can only utilize 25% of single state excitons, and thus the external quantum efficiency is only limited within 5%. Almost all triplet state excitons may be lost only in the form of heat to enhance the efficiency of organic electroluminescent devices, and the triplet state excitons needs to be fully utilized.

Researchers have put forward many methods for utilizing the triplet state excitons. The most prominent one is the utilization of phosphorescent material. Phosphorescent material, into which heavy atoms are introduced, has a spin-orbit coupling effect. Thus, 75% of triplet state may be fully utilized so that 100% of internal quantum efficiency is achieved. However, rare heavy metals which are expensive are used in the phosphorescent material, which is disadvantageous to the reduction of cost of products. If fluorescent devices can make good use of triplet state excitons, this problem may be dissolved very well. Researchers have proposed the generation of the singlet state by the triplet state annihilation in a fluorescent device to improve the efficiency of the fluorescent device. However, the maximum external quantum efficiency that may be theoretically achieved by this method is only 62.5% which is much lower than that of the phosphorescent material. Thus, it is very necessary to find a new technology to make full use of triplet state energy level of the fluorescent material in order to enhance the light-emitting efficiency.

SUMMARY

To solve technical problems mentioned above, the present invention provides a novel organic electroluminescent device and a manufacturing method thereof.

For the purposes of fully utilizing 75% of triplet state generated in a fluorescent device, enhancing the light-emitting efficiency of the device, and reducing the cost of devices, the present invention provides a light-emitting layer of a novel organic electroluminescent device. Host material in this light-emitting layer is special material with charge-transfer transition.

The present invention also provides an organic electroluminescent device including the light-emitting layer mentioned above, including an anode, a hole transport layer, a light-emitting layer, an electron transport layer and a cathode which are stacked.

The present invention also provides a method for manufacturing the organic electroluminescent, including: successively depositing an anode, a hole transport layer, a light-emitting layer, an electron transport layer and a cathode, on a substrate, which are stacked; and then packaging, wherein the host material of the light-emitting layer is a special material with charge-transfer transition.

When there are a donor group and an acceptor group in one type of host material, intra-molecular charge-transfer transition (CT) will often occur, and the resulting exited state is a CT state. Meanwhile, with the presence of hetero atoms, other transitions (for example, n-π transition or the like) will occur in the material. Thus, the singlet state and the triplet state of material may be divided into: singlet state of CT state, singlet state of (n-π) state transition, triplet state of CT state, and triplet state of (n-π) state transition. Generally, the energy level of CT excited state is higher than that of (n-π) excited state. The triplet state of the CT excited state is higher than that of (n-π) excited state. The difference in energy level between the two may be specifically described by electron volt (eV). According to difference in material structure, there may be three cases: 1) a very small difference in energy level between the two, for example, 0 to 0.3 eV; 2) a very great difference in energy level between the two, for example, above 1.0 eV; and 3) a difference in energy level between the above two cases. Herein, the following host material is selected: material with a small difference in energy level (0 to 0.3 eV) between the triplet state of the CT excited state and the triplet state of the (n-π) excited state; or material with a great difference in energy level (higher than 1.0 eV) but a second triplet state of the (n-π) excited state slightly lower or higher than the first singlet state of the CT excited state (a difference of 0 to 0.1 eV between the two). The energy level structure of material is as shown in FIG. 1 and FIG. 2.

In the first type of host material, the first triplet state in the (n-π) excited state is slightly lower than that in the CT excited state (0 to 0.3 eV). Thus, when absorbing heat from the outside, the first triplet state of the (n-π) excited state will transition to the first triplet state of the CT excited state with higher energy, and transition back to the first singlet state of the CT excited state from the first triplet state. Thus, energy is transferred to a dye in order to emit light. By this method, the triplet state of the host material will be fully utilized. The CT state may be obtained in a compound having both of a donor group and an acceptor group. As the donor and the acceptor are separated spatially, an HOMO energy level and an LUMO energy level which are separated spatially may be obtained. Difference in energy level between the triplet state and the singlet state of the CT state is in proportion to the overlapping of HOMO and LUMO. In view of this, the energy level of HOMO and LUMO, which are separated, can have a small difference in energy level between the singlet state and the triplet state of the CT state, and such an energy level difference is generally lower than 0.3 eV. With the design of such material, by introducing a large-volume donor group (for example, indolocarbazolyl) or an acceptor group, the material is caused to be distorted to some extent so that the spatial separation is realized; or, by introducing a linking group with spatial distortion (for example, spirofluorenyl), the donor group and the acceptor group are separated.

In the second type of host material, the first triplet state of the (n-π) excited state is far lower than that of the CT excited state (higher than 1.0 eV). Thus, when electro-excited, the first triplet state of the (n-π) excited state is seldom generated, and the second triplet state of the (n-π) excited state is mostly generated. However, since the energy of the second triplet state may be transferred to the first singlet state of the CT excited state, the energy is transferred to the dye to emit light so that 100% of light-emitting efficiency is achieved. Such material has both of localized state and CT state, and there is a great difference in energy level between the singlet state and the triplet state of the localized state, thereby making the intersystem crossing from the singlet state to the triplet state difficult. Meanwhile, there is a small difference in energy level between the triplet state of the CT state and the singlet state of the localized state of the material. Thus, the triplet state of the CT state of the material may be transferred to the singlet state. In order to obtain such a function, material, which has certain spatial distortion and in which both the donor group and the acceptor group exist so that the CT state is obtained, is required. Meanwhile, it is required that there is a great difference in energy level between the localized singlet state and the triplet state of the donor group (or the acceptor group). According to what was reported in literatures, difference in energy level between the singlet state and the triplet state of phenanthroimidazolyl, naphthoimidazolyl, benzothiazolyl or anthryl is above 1.0 eV, and such material contains acceptor groups only. Thus, by bonding certain donor groups, compounds with such effects may be obtained.

Other host material with unsuitable energy level for the two types of material is unable to effectively utilize the triplet state by the above method, and thus will be not considered.

An organic electroluminescent device provided by the present invention comprises an anode, a hole transport layer, a light-emitting layer, an electron transport layer and a cathode which are stacked, the light-emitting layer including a host material and a luminescent dye, wherein the host material of the light-emitting layer is a material in which the triplet state energy level in a CT excited state is higher than that in an n-π excited state by 0 to 0.3 eV; or the host material of the light-emitting layer is a material in which the triplet state energy level in a CT excited state is higher than that in an n-π excited state by more than 1.0 eV, and the difference between the second triplet state energy level in the n-π excited state of the host material and the first singlet state energy level in the CT excited state is −0.1 to 0.1 eV; and the luminescent dye is a fluorescent dye.

Preferably, the singlet state energy level of the fluorescent dye is lower than that of the host material.

The host material is a material with charge-transfer transition, and the host material has both a donor group unit and an acceptor group unit.

The donor group unit is a group consisting of one donor group or more than two donor groups connected together.

The acceptor group unit is a group consisting of one acceptor group or more than two acceptor groups connected together.

The donor group is selected from indolocarbazolyl; carbazolyl; dicarbazyl; triphenylamine; phenoxazine; indolocarbazolyl substituted by more than one of $C_{1-6}$ alkyl, methoxyl, ethyoxyl or phenyl; carbazolyl substituted by more than one of $C_{1-6}$ alkyl, methoxyl, ethyoxyl or phenyl; dicarbazyl substituted by more than one of $C_{1-6}$ alkyl, methoxyl, ethyoxyl or phenyl; triphenylamine substituted by more than one of $C_{1-6}$ alkyl, methoxyl, ethyoxyl or phenyl; or phenoxazine substituted by more than one of $C_{1-6}$ alkyl, methoxyl, ethyoxyl or phenyl.

The acceptor group is selected from naphthyl; anthryl; phenanthryl; pyrenyl; triazinyl; benzimidazolyl; cyano; pyridyl; sulfonyl; phenanthroimidazolyl; naphthoimidazolyl; benzothiazolyl; oxiadiazolyl; naphthyl substituted by more than one of $C_{1-6}$ alkyl, methoxyl, ethyoxyl, phenyl or pyridyl; anthryl substituted by more than one of $C_{1-6}$ alkyl, methoxyl, ethyoxyl, phenyl or pyridyl; phenanthryl substituted by more than one of $C_{1-6}$ alkyl, methoxyl, ethyoxyl, phenyl or pyridyl; pyrenyl substituted by more than one of $C_{1-6}$ alkyl, methoxyl, ethyoxyl, phenyl or pyridyl; triazinyl substituted by more than one of $C_{1-6}$ alkyl, methoxyl, ethyoxyl, phenyl or pyridyl; benzimidazolyl substituted by more than one of $C_{1-6}$ alkyl, methoxyl, ethyoxyl, phenyl or pyridyl; pyridyl substituted by more than one of $C_{1-6}$ alkyl, methoxyl, ethyoxyl, phenyl or pyridyl; sulfonyl substituted by more than one of $C_{1-6}$ alkyl, methoxyl, ethyoxyl, phenyl or pyridyl; phenanthroimidazolyl substituted by more than one of $C_{1-6}$ alkyl, methoxyl, ethyoxyl, phenyl or pyridyl; naphthoimidazolyl substituted by more than one of $C_{1-6}$ alkyl, methoxyl, ethyoxyl, phenyl or pyridyl; benzothiazolyl substituted by more than one of $C_{1-6}$ alkyl, methoxyl, ethyoxyl, phenyl or pyridyl; and oxiadiazolyl substituted by more than one of $C_{1-6}$ alkyl, methoxyl, ethyoxyl, phenyl or pyridyl.

One or more of the donor group units are directly linked to one or more of the acceptor group units to form the host material; or one or more of the donor group units and one or more of the acceptor group units are respectively linked to a linking group to form the host material, the linking group being a group with steric hindrance.

Preferably, one or two donor group units and one or two acceptor group units are respectively linked to a linking group to form the host material; or one or two acceptor group units are directly linked to one or two donor group units to form the host material.

Preferably, the linking group is selected from spiro-fluorenyl; phenyl; biphenylyl; spiro-fluorenyl substituted by at least one of $C_{1-6}$ alkyl or phenyl; phenyl substituted by at least one of $C_{1-6}$ alkyl or phenyl; or biphenylyl substituted by at least one of $C_{1-6}$ alkyl or phenyl.

Further preferably, the donor group is selected from the following groups:

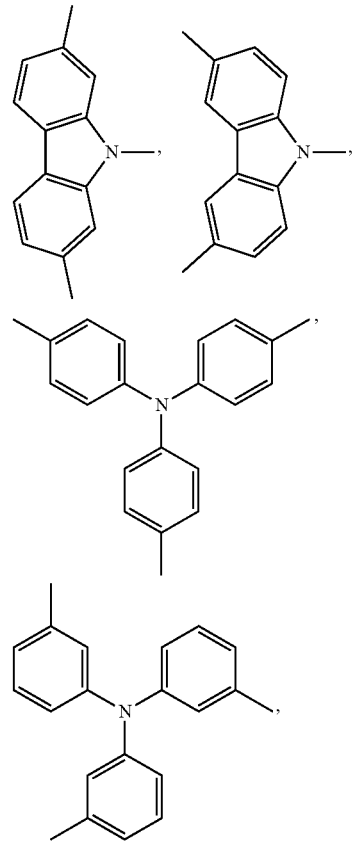

-continued
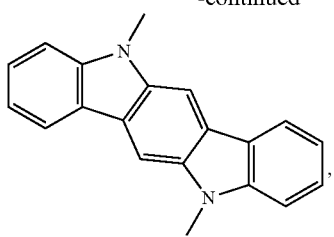
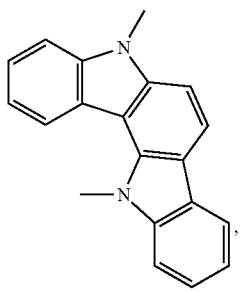
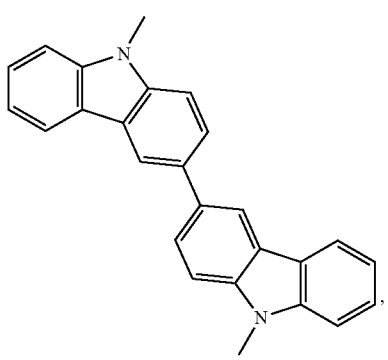
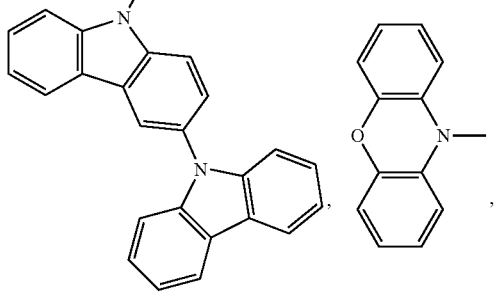
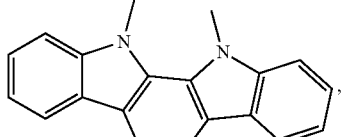
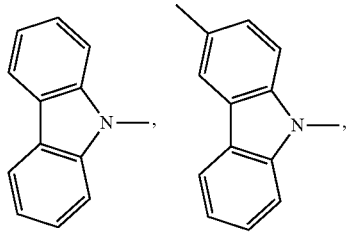
-continued
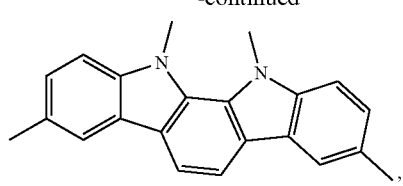
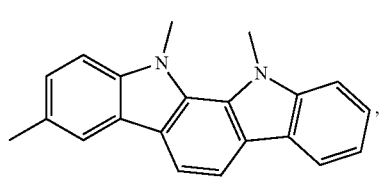
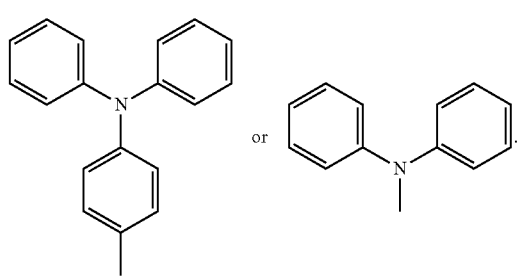
Further preferably, the acceptor group is selected from the following groups:
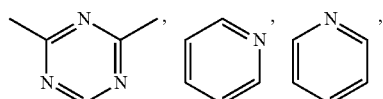
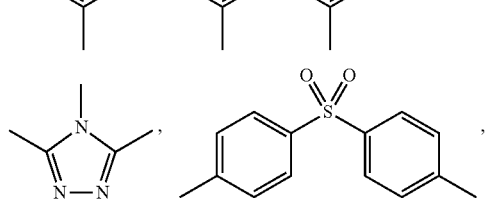
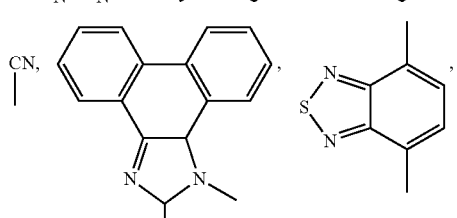
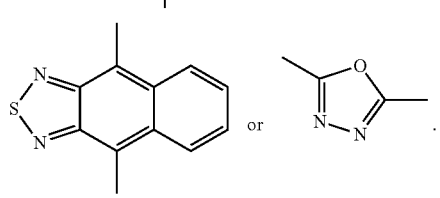
More preferably, the host material has the following structures:

1-1
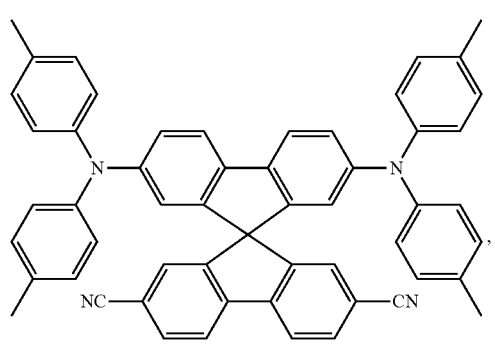
1-2
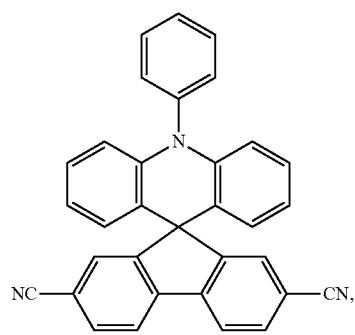
1-3
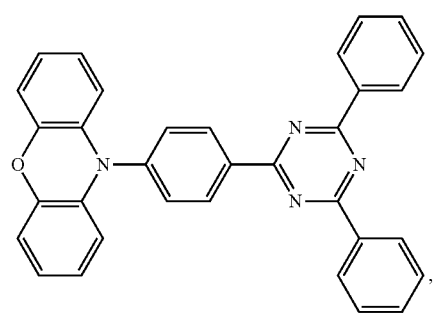
1-4
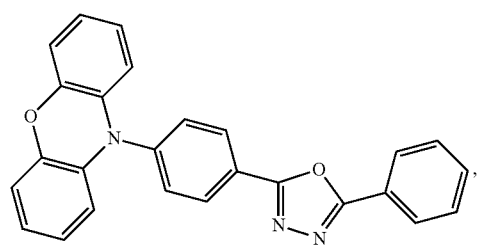
1-5
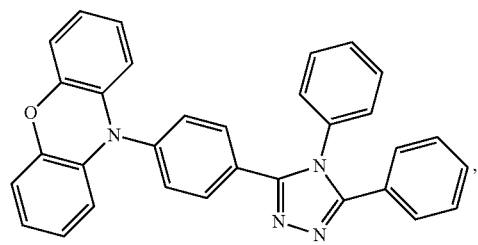
1-6
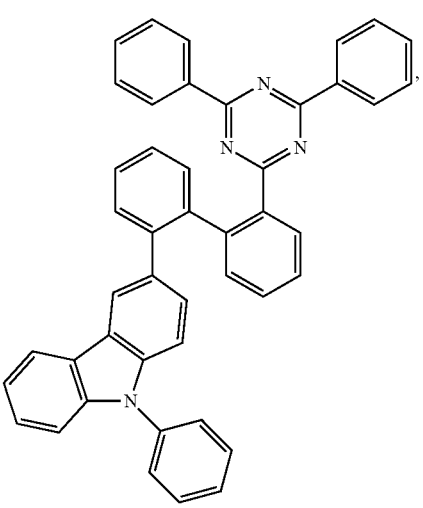
1-7
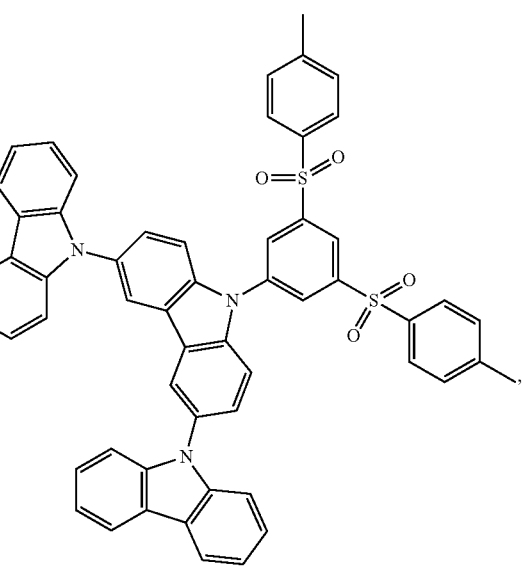
1-8
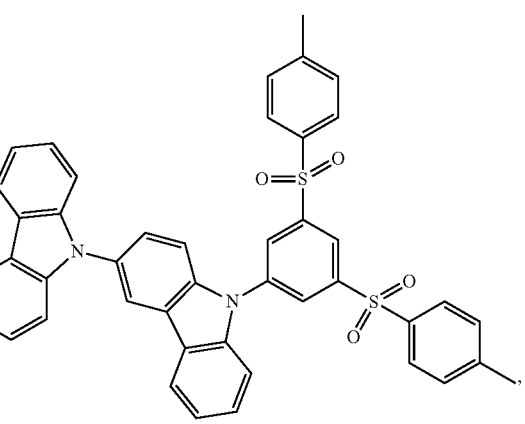

-continued
1-9
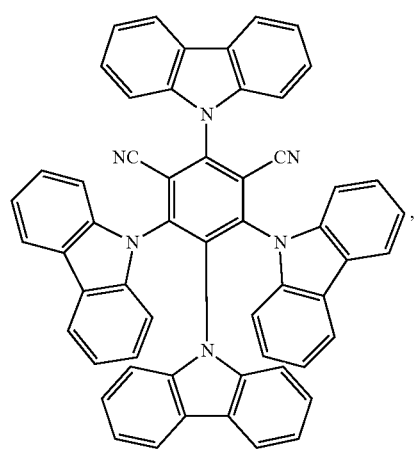
1-10
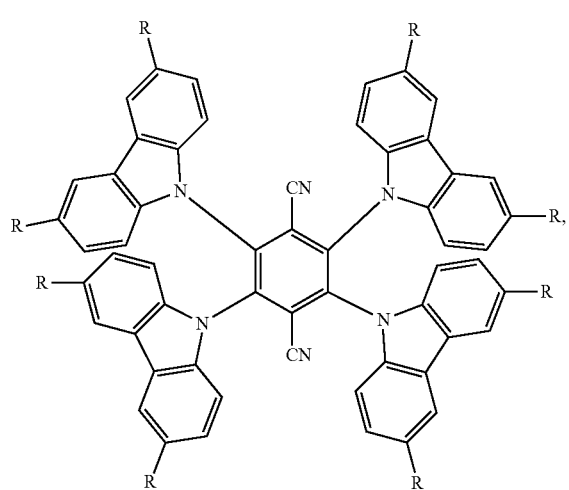
1-11
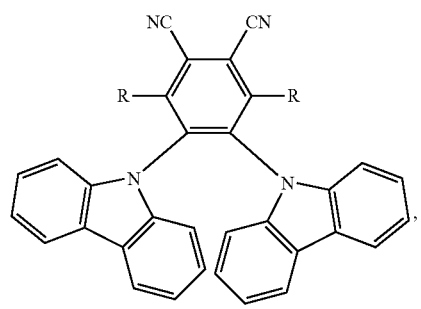
1-12
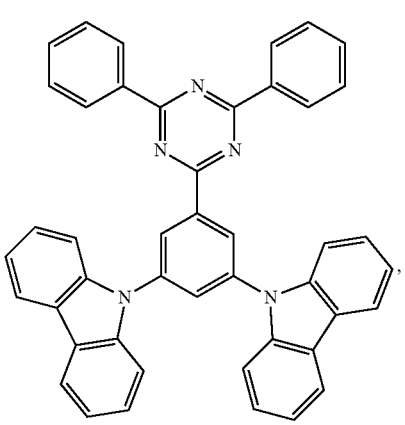
-continued
2-1
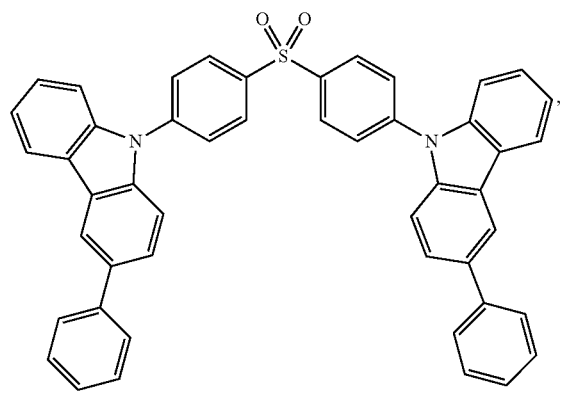
2-2
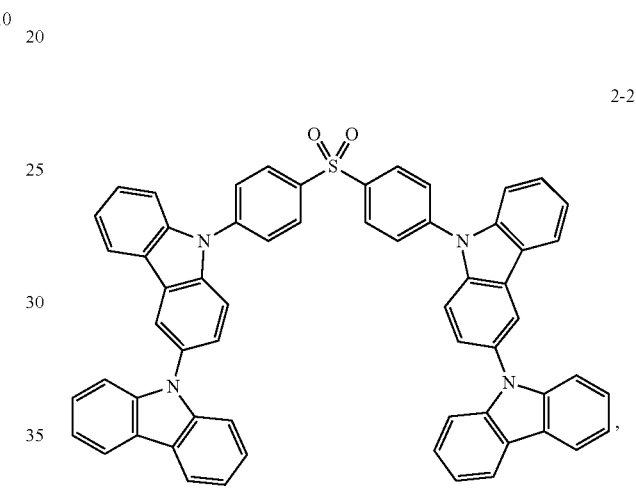
2-3
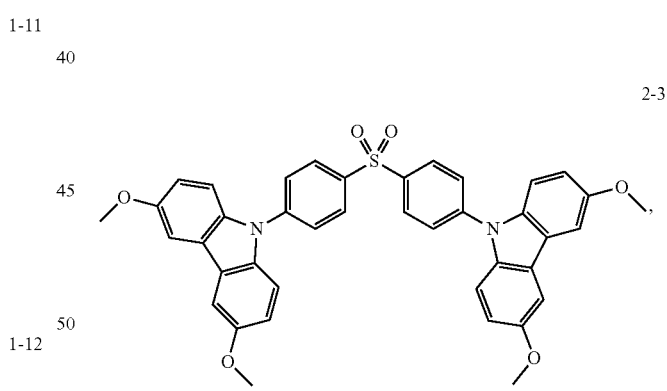
2-4
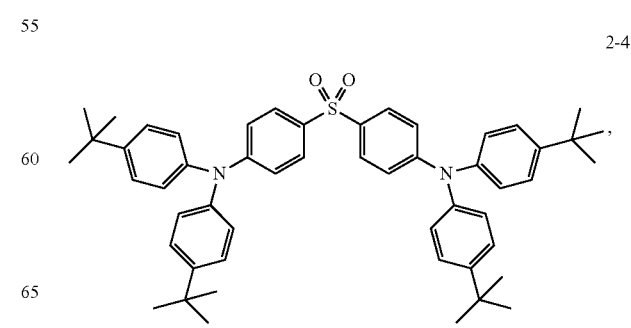

2-5 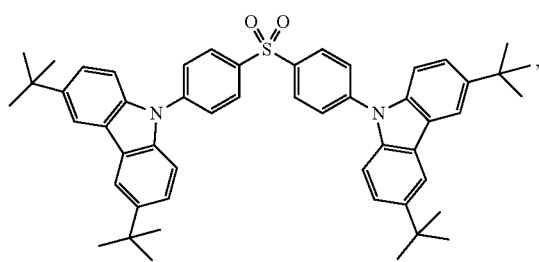
2-9 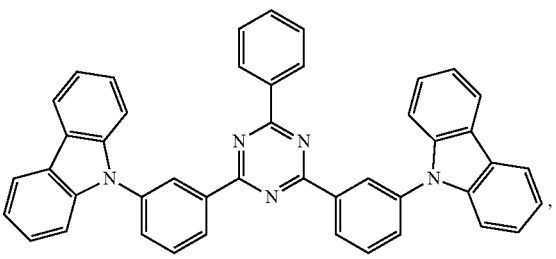
2-6 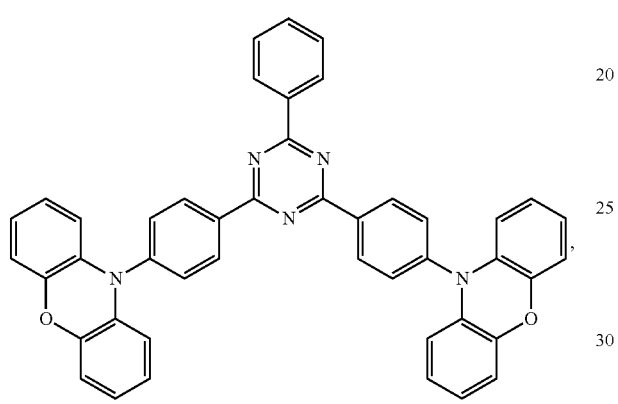
2-10 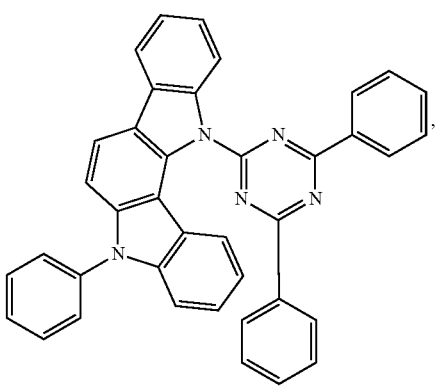
2-7 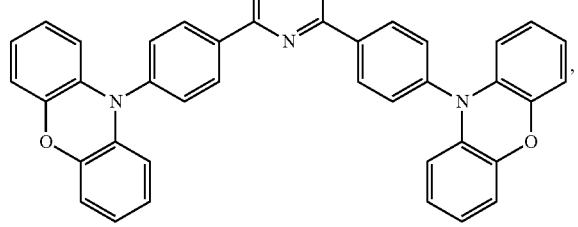
2-11 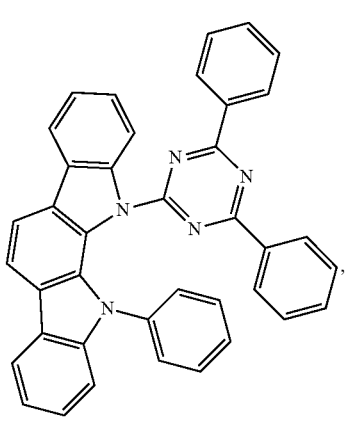
2-8 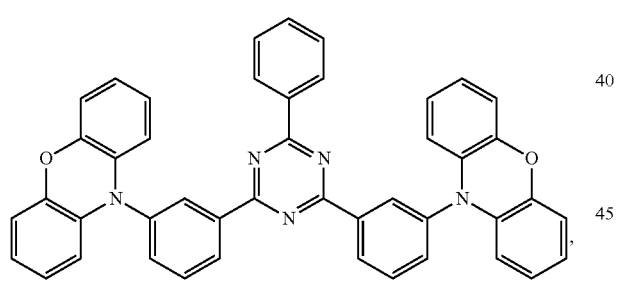
2-12 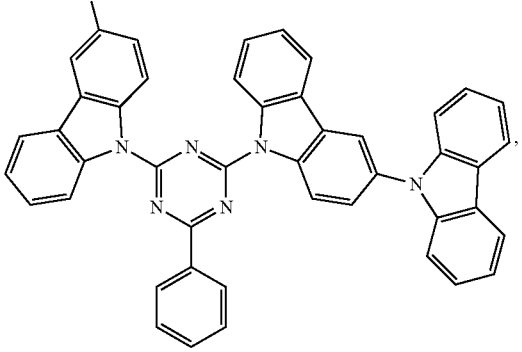

2-13
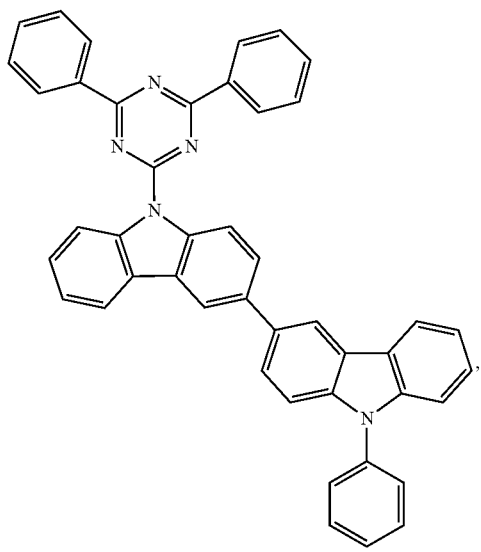
2-14
2-15
3-1
3-2
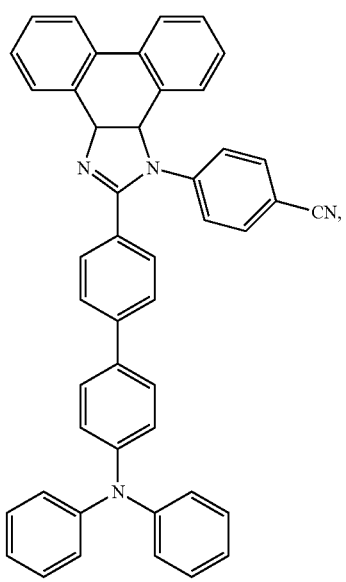
3-3
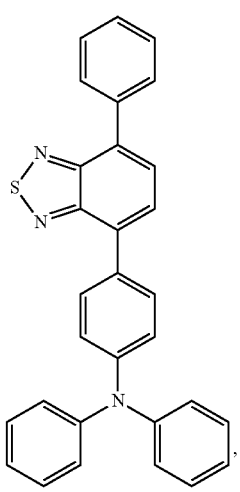
3-4
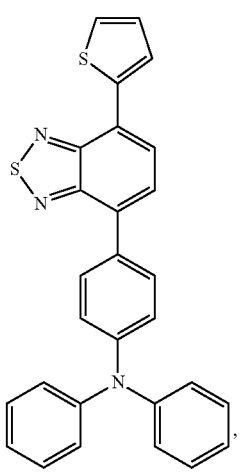

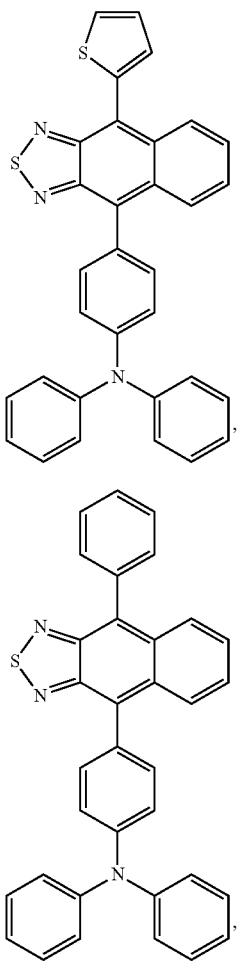

Preferably, the luminescent dye is a fluorescent dye with the triplet state energy level lower than 2.3 eV. More preferably, the fluorescent dye is selected from coumarins or bipyranes.

Preferably, the doping concentration of the fluorescent dye in the light-emitting layer is not greater than 5% by weight. Further preferably, the doping concentration of the fluorescent dye in the light-emitting layer is 0.001% to 1% by weight. More preferably, the doping concentration of the fluorescent dye in the light-emitting layer is 0.1% to 1% by weight.

Preferably, the triplet state energy level of the material of the hole transport layer is higher than that of the host material. Further preferably, the triplet state energy level of the material of the hole transport layer is higher than 2.5 eV. More preferably, the hole transport layer is made from a low-molecular material, for example, arylamines and/or branched polymers, and most preferably N,N'-diphenyl-N, N'-(1-naphthyl)-1,1'-biphenyl-4,4'-di amine.

Preferably, the triplet state energy level of the material of the electron transport layer is higher than 2.5 eV.

Preferably, a hole injection layer is provided between the anode and the hole transport layer. The hole injection layer is made from 4,4',4''-tris(3-methylphenylaniline) triphenylamine doped with F4TCNQ, or copper phthalocyanine, or metal oxide for example molybdenum oxide and rhenium oxide.

The present invention provides a method for preparing the organic electroluminescent device, including: successively depositing an anode, a hole transport layer, a light-emitting layer, an electron transport layer and a cathode which are stacked; and then packaging the deposition.

The present invention achieves the following technical effect:

With the organic electroluminescent device according to the present invention, since a new host material in the light-emitting layer is used, which has both a donor group and an acceptor group, and the triplet state generated in the light-emitting layer may be fully utilized to achieve 100% of light-emitting efficiency in the fluorescent device. Furthermore, no noble metal is required, thus reducing the cost.

Figure 1:
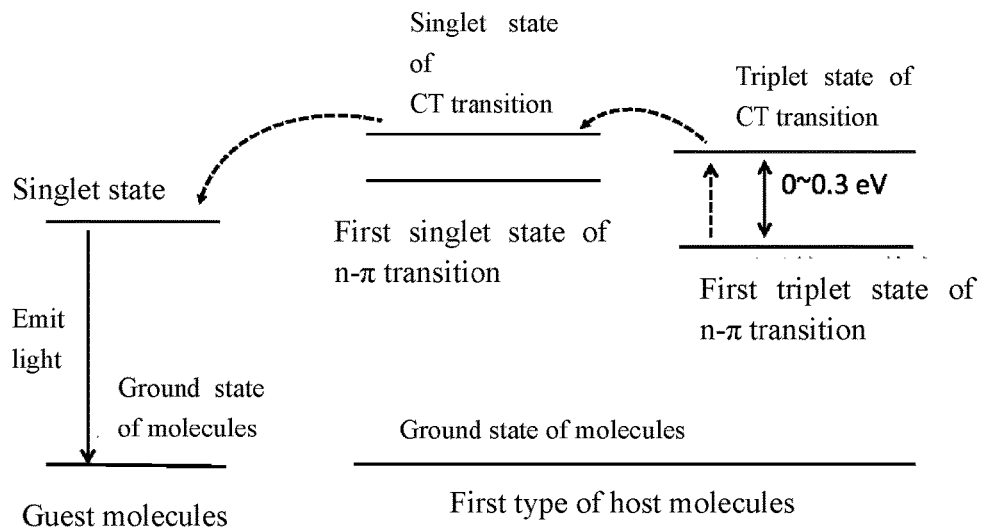
FIG. 1 is a schematic diagram illustrating energy transfer and light emitting of a light-emitting layer of an organic electroluminescent device made from a first type of material.
Figure 2:
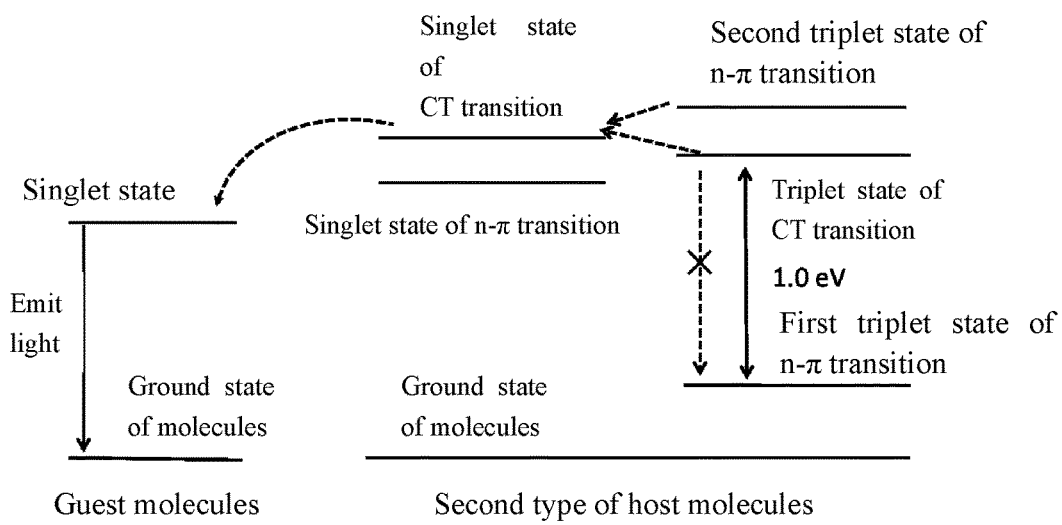
FIG. 2 is a schematic diagram illustrating energy transfer and light emitting of a light-emitting layer of an organic electroluminescent device made from a second type of material.

Reference numerals and denotations thereof:
01: Substrate
02: Anode layer
03: Cathode layer
04: Hole injection layer
05: Hole transport layer
06: Light-emitting layer
07: Electron transport layer

DETAILED DESCRIPTION

The present invention will be further described with reference to the accompany drawings and specific embodiments to make those skilled in the art better understand the present invention and put it into practice. However, the embodiments exemplified are not intended to limit the present invention.

The organic electroluminescent device of the present invention includes an anode, a hole transfer layer, a light-emitting layer, an electron transport layer and a cathode, which are stacked, wherein the host material of the light-emitting layer is a material with a small difference in energy level (0 to 0.3 eV) between the triplet state of the CT excited state and the triplet state of the n-π excited state, and material with a great difference in energy level (more than 10 eV) between the two but the second triplet state of the n-π excited state slightly lower or higher than the first singlet state of the CT excited state (a difference of 0 to 0.1 eV between the two). The material selected or designed herein has both of donor groups and acceptor groups, which are spatially separated from each other, leading to spatial separation of HOMO energy level and LUMO energy level with reduced overlap integral. As a result, there is a small difference in energy level between the singlet state and the triplet state of the CT state of the material. Meanwhile, difference in energy level between the singlet state and the triplet state of phenanthroimidazolyl, naphthoimidazolyl, benzothiazolyl or anthryl which are selected herein is above 1.0 eV, and thus the requirements of the second type of material can also be met.

The host material is preferably doped with a fluorescent dye, and the energy level of the singlet state of the fluorescent dye is lower than that of the CT state of the host material. The light-emitting wavelength of the fluorescent dye selected is longer than that of the host material, and thus the energy level of the singlet state of the dye may be promised to be lower than that of the host material. By doping with the fluorescent dye, the energy from the singlet state of the CT state of the host material may be directly transferred to the fluorescent dye. Radiation lifetime of the singlet state excitons of the CT state is shortened by the energy transfer, and thus the utilization efficiency of the triplet state of the CT state is enhanced to obtain high light-emitting efficiency.

The concentration of the fluorescent dye is preferably lower than the mass concentration of 1%, and material with a relatively great overlapping between the absorption spectrum of the fluorescent dye and the body emission spectrum is preferred. In view of this, efficiency for energy transfer is enhanced, and meanwhile, Dexter energy transfer within short distance is reduced since excitons in this portion will be lost. Meanwhile, the triplet state energy level of the electron transport material and the hole transport material in the present invention is higher than that of the host material, which helps to confine excitons in the light-emitting layer. The triplet state energy level of the fluorescent dye in the present invention is lower than 2.3 eV, while the triplet state energy level of the electrons and holes is higher than 2.5 eV. Thus, the excitons in the light-emitting layer may be effectively confined.

The light-emitting layer of the organic electroluminescent device of the present invention includes host material and a luminescent dye, the host material is material with charge-transfer transition, and the host material has both of a donor group unit and an acceptor group unit. The donor group unit is a group consisting of one donor group or more than two donor groups connected together; and the acceptor group unit is a group consisting of one acceptor group or more than two acceptor groups connected together.

Specifically, the structure of the host material may be a donor-connection-acceptor structure or a donor-acceptor-donor structure or the like.

The donor group is selected from indolocarbazolyl; carbazolyl; dicarbazyl; triphenylamine; phenoxazine; indolocarbazolyl substituted by more than one of $C_{1-6}$ alkyl, methoxyl, ethyoxyl or phenyl; carbazolyl substituted by more than one of $C_{1-6}$ alkyl, methoxyl, ethyoxyl or phenyl; dibenzofuryl substituted by more than one of $C_{1-6}$ alkyl, methoxyl, ethyoxyl or phenyl; triphenylamine substituted by more than one of $C_{1-6}$ alkyl, methoxyl, ethyoxyl or phenyl; or phenoxazine substituted by more than one of $C_{1-6}$ alkyl, methoxyl, ethyoxyl or phenyl.

The acceptor group is selected from naphthyl; anthryl; phenanthryl; pyrenyl; triazinyl; benzimidazolyl; cyano; pyridyl; sulfonyl; phenanthroimidazolyl; naphthoimidazolyl; benzothiazolyl; oxiadiazolyl; naphthyl substituted by more than one of $C_{1-6}$ alkyl, methoxyl, ethyoxyl, phenyl or pyridyl; anthryl substituted by more than one of $C_{1-6}$ alkyl, methoxyl, ethyoxyl, phenyl or pyridyl; phenanthryl substituted by more than one of $C_{1-6}$ alkyl, methoxyl, ethyoxyl, phenyl or pyridyl; pyrenyl substituted by more than one of $C_{1-6}$ alkyl, methoxyl, ethyoxyl, phenyl or pyridyl; triazinyl substituted by more than one of $C_{1-6}$ alkyl, methoxyl, ethyoxyl, phenyl or pyridyl; benzimidazolyl substituted by more than one of $C_{1-6}$ alkyl, methoxyl, ethyoxyl, phenyl or pyridyl; pyridyl substituted by more than one of $C_{1-6}$ alkyl, methoxyl, ethyoxyl, phenyl or pyridyl; sulfonyl substituted by more than one of $C_{1-6}$ alkyl, methoxyl, ethyoxyl, phenyl or pyridyl; phenanthroimidazolyl substituted by more than one of $C_{1-6}$ alkyl, methoxyl, ethyoxyl, phenyl or pyridyl; naphthoimidazolyl substituted by more than one of $C_{1-6}$ alkyl, methoxyl, ethyoxyl, phenyl or pyridyl; benzothiazolyl substituted by more than one of $C_{1-6}$ alkyl, methoxyl, ethyoxyl, phenyl or pyridyl; and oxiadiazolyl substituted by more than one of $C_{1-6}$ alkyl, methoxyl, ethyoxyl, phenyl or pyridyl.

One or more of the donor group units are directly linked to one or more of the acceptor group units to form the host material; or one or more of the donor group units and one or more of the acceptor group units are respectively linked to a linking group to form the host material, the linking group being a group with steric hindrance.

The linking group is selected from spiro-fluorenyl; phenyl; biphenylyl; spiro-fluorenyl substituted by at least one of $C_{1-6}$ alkyl or phenyl; phenyl substituted by at least one of $C_{1-6}$ alkyl or phenyl; or biphenylyl substituted by at least one of $C_{1-6}$ alkyl or phenyl.

The donor group is preferably selected from the following structures:

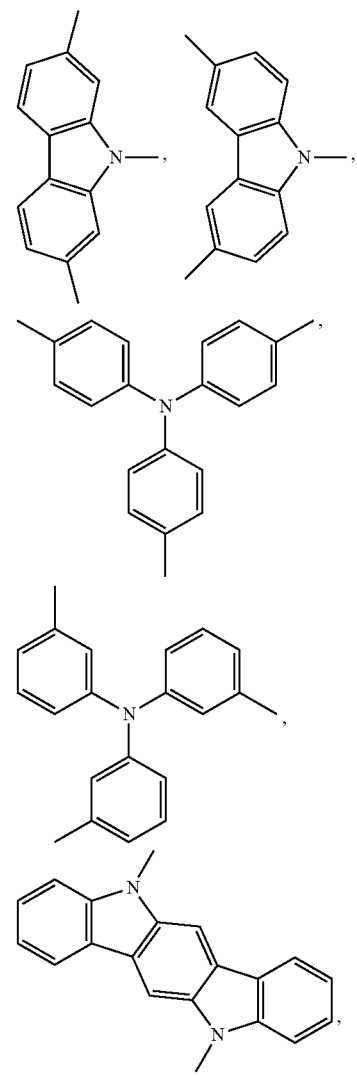

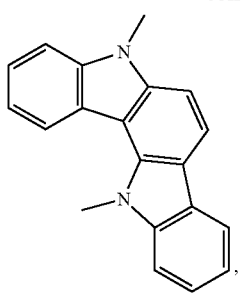
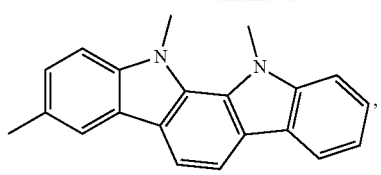
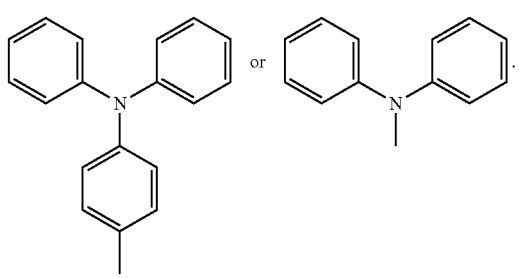
The acceptor group is preferably selected from the following structures:
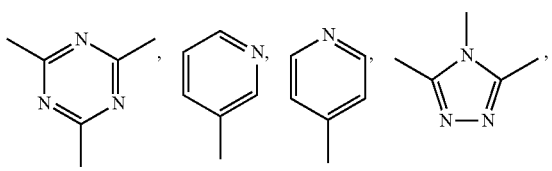
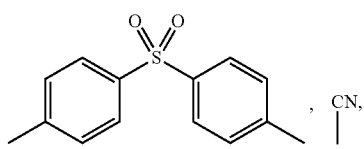
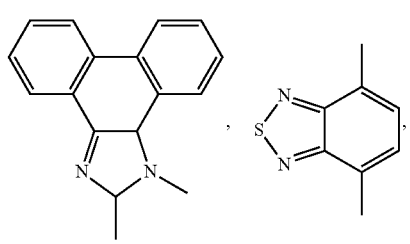
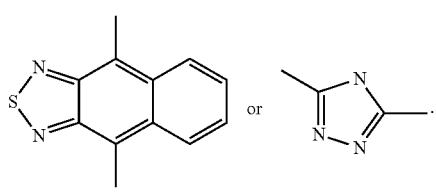
Specifically, the host material is selected from compounds with the following structures:

1-1
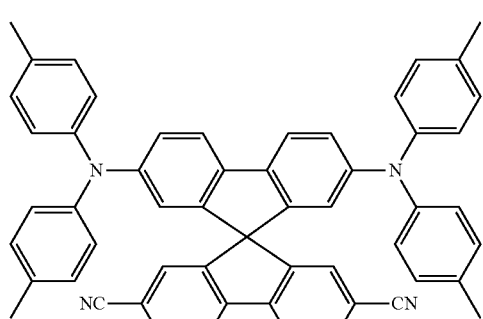
(Chem. Commun., 2012, 48, 9580-9582)
1-2
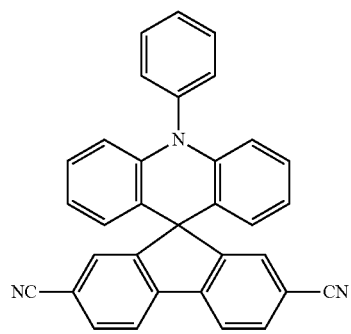
(Angew. Chem. Int. Ed., 2012, 51, 11311-11315)
1-3
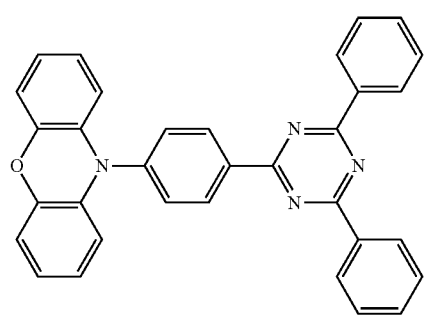
(Chem. Commun., 2012, 48, 11392,-11394)
1-4
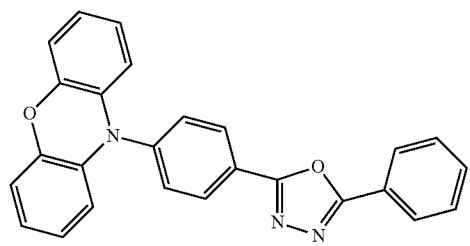
(J. Mater. Chem. C, 2013, 1, 4599-4604)
1-5
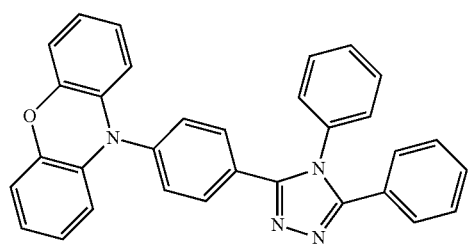
(J. Mater. Chem. C, 2013, 1, 4599-4604)
1-6
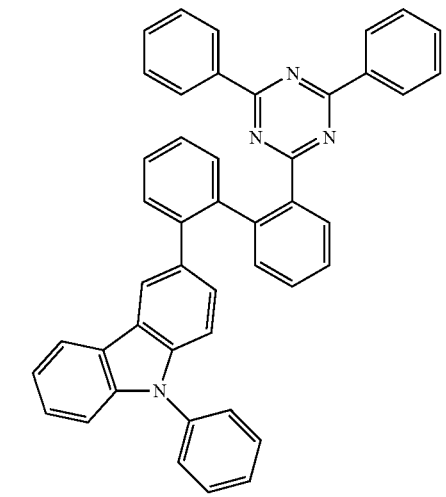
(Phys. Chem. Chem. Phys., 2013, 15, 15850)
1-7
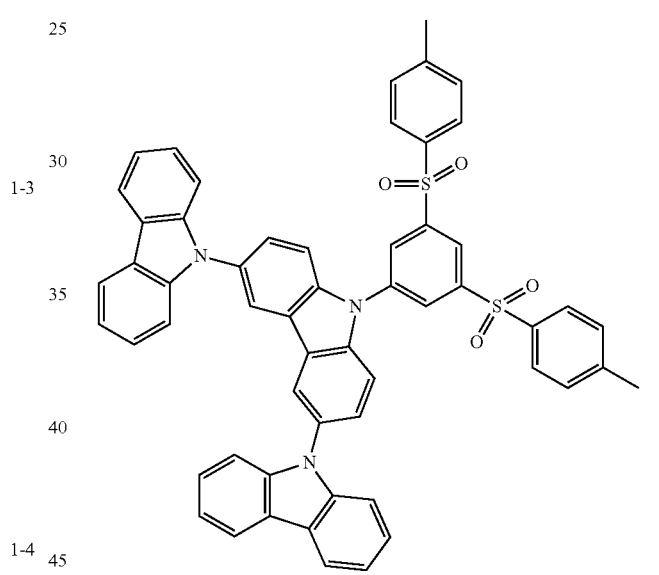
($\Delta E_{ST}$ = 0.11, calculated by using Gaussian 03/TD-DFT)
1-8
($\Delta E_{ST}$ = 0.14, calculated by using Gaussian 03/TD-DFT)

1-9
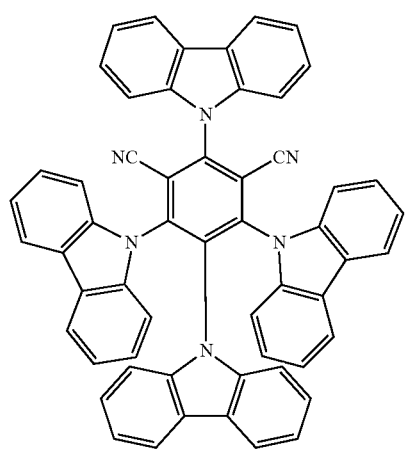
(Nature, 2012, 494, 234)
1-10
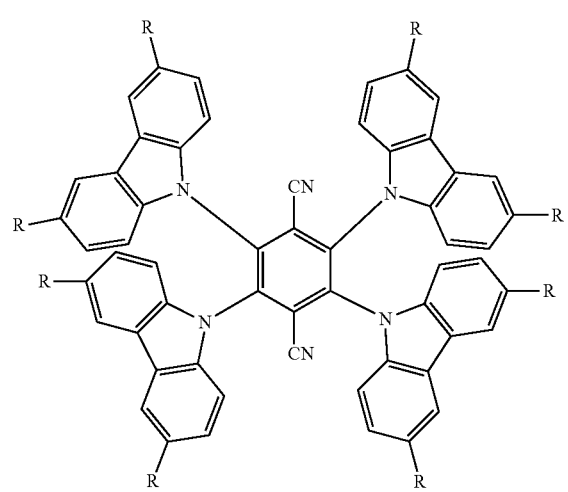
(Nature, 2012, 492, 234)
1-11
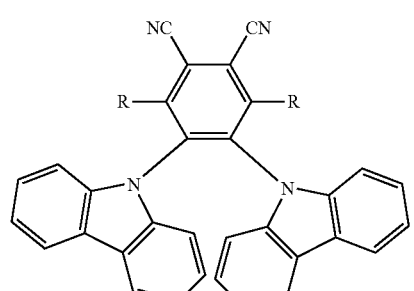
(Nature, 2012, 492, 234)
1-12
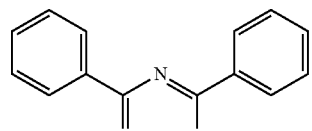
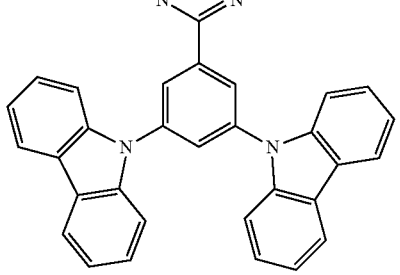
($\Delta E_{ST}$ = 0.21, calculated by using Gaussian 03/TD-DFT)
2-1
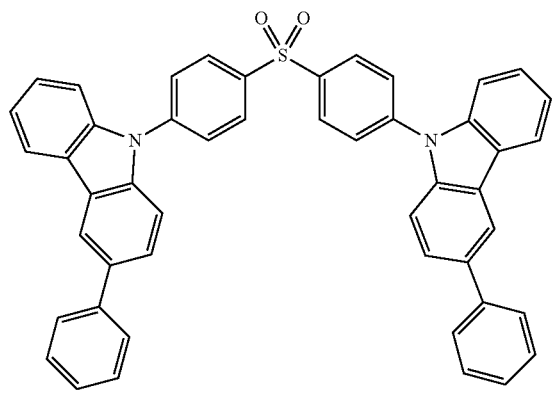
($\Delta E_{ST}$ = 0.15, calculated by using Gaussian 03/TD-DFT)
2-2
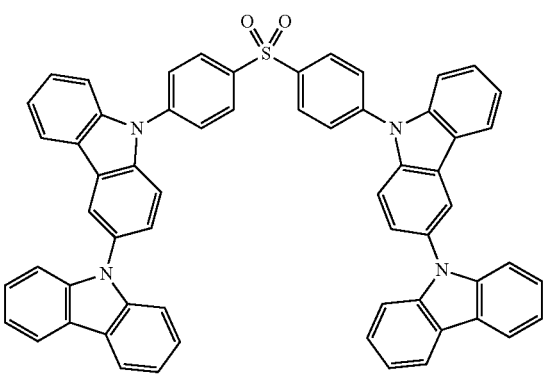
($\Delta E_{ST}$ = 0.04, calculated by using Gaussian 03/TD-DFT)
2-3
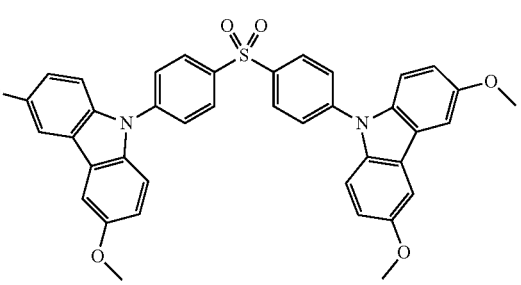

2-4
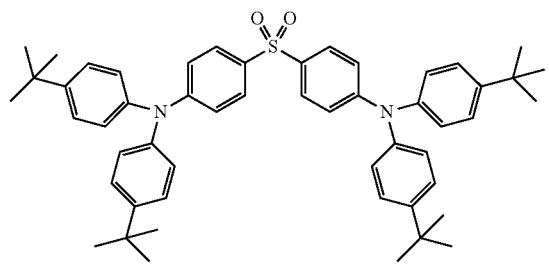
(J. AM. Chem. Soc. 2012, 134, 14706-14709)
2-5
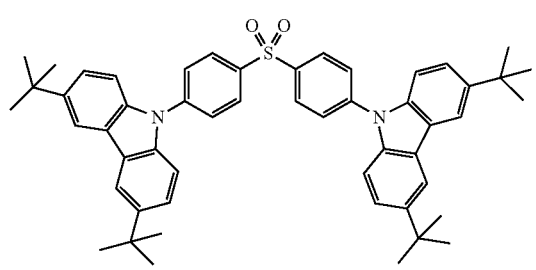
(J. AM. Chem. Soc. 2012, 134, 14706-14709)
2-6
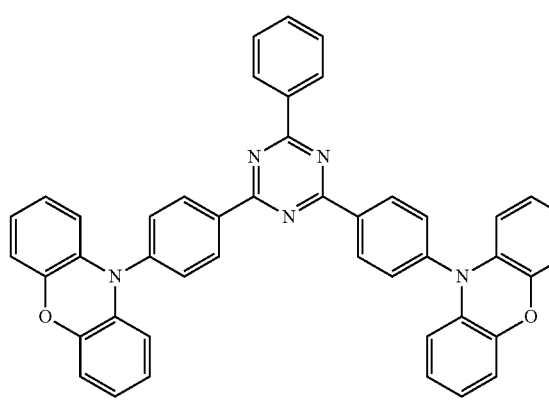
(Chem. Mater., 2013, 25 (18), pp 3766-3771)
2-7
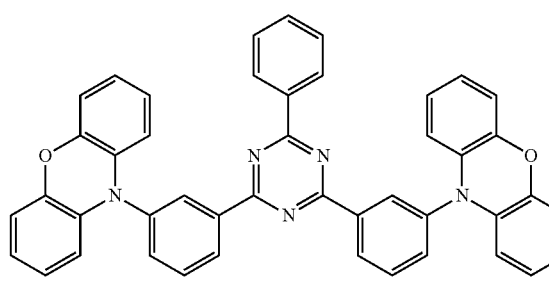
($\Delta E_{ST}$ = 0.07, calculated by using Gaussian 03/TD/DFT)
2-8
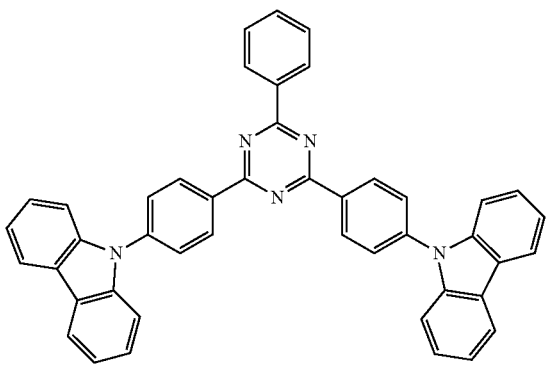
($\Delta E_{ST}$ = 0.16, calculated by using Gaussian 03/TD/DFT)
2-9
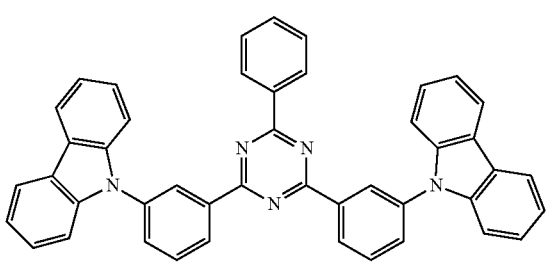
($\Delta E_{ST}$ = 0.07, calculated by using Gaussian 03/TD/DFT)
2-10
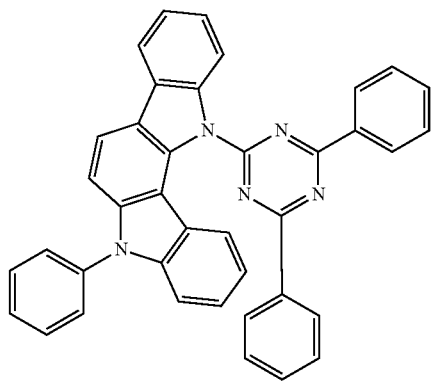
(PRL, 2013, 110, 247401)
2-11
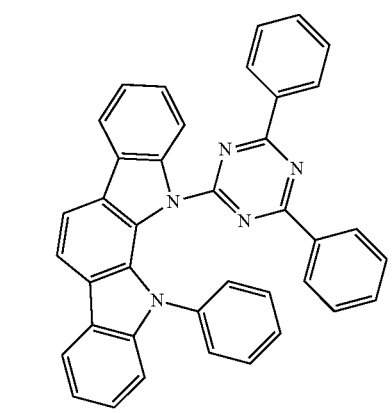
($\Delta E_{ST}$ = 0.06, calculated by using Gaussian 03/TD-DFT)

2-12
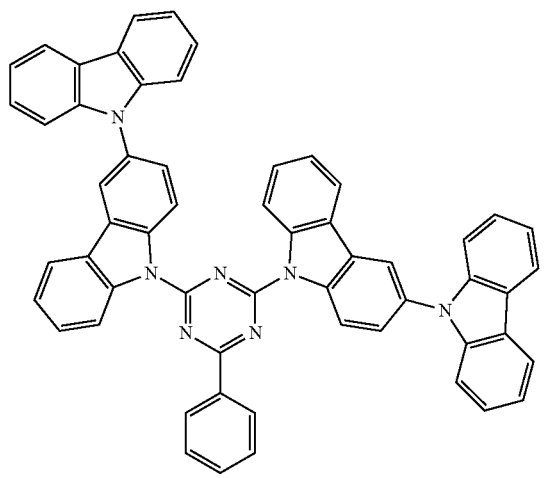
(Appl. Phys. Lett., 2012, 101, 093306)
2-13
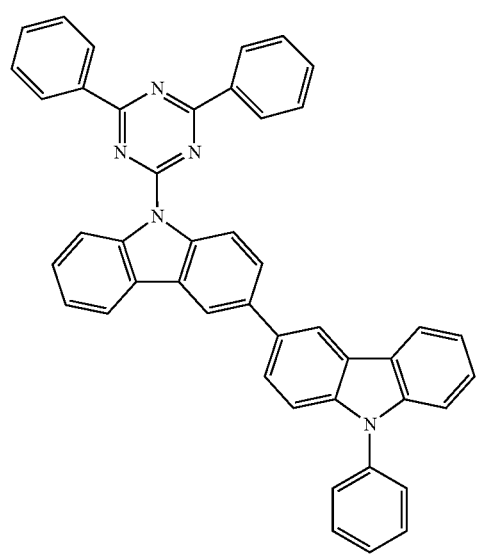
(Phys. Chem. Chem. Phys. 2013, 15, 15850)
2-14
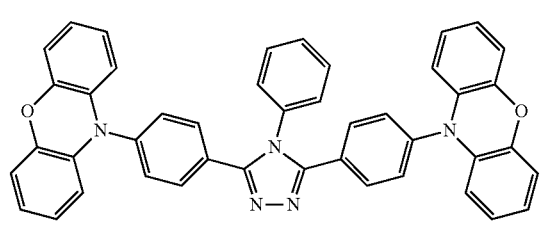
(J. Mater. Chem. C, 2013, 1, 4599-4604)
2-15
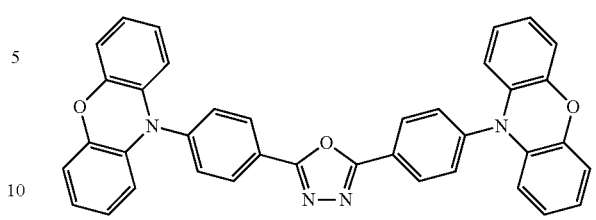
(J. Mater. Chem. C, 2013, 1, 4599-4604)
3-1
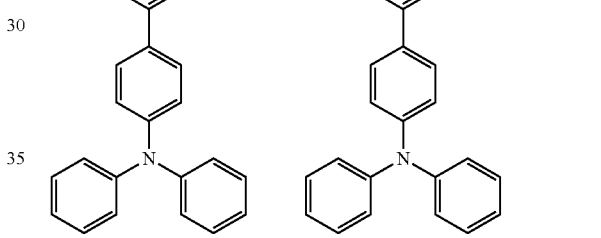
(CC, DOI: 10.10393 (CC. DOI: 10.1039/c3cc47130f)
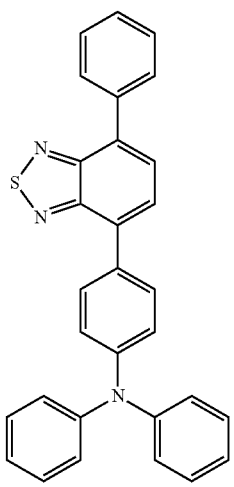 [SMILES: c1ccc(-c2ccc(-c3ccc(N(c4ccccc4)c4ccccc4)cc3)c3nsnc23)cc1]
3-3 ($\Delta E_{ST}$ of the CT state is 0.03, and meanwhile the difference in energy level between the singlet state and the triplet state of the localized state is 1.1 eV, which is calculated by using Gaussian 03/TD-DFT)

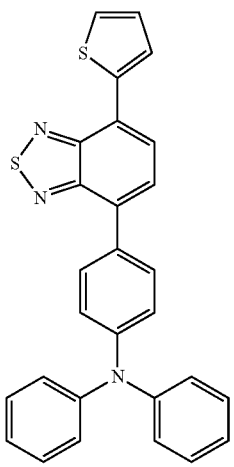 [SMILES: c1ccc(N(c2ccccc2)c2ccc(-c3ccc(-c4cccs4)c4nsnc34)cc2)cc1]

3-4 ($\Delta E_{ST}$ of the CT state is 0.05, and meanwhile the difference in energy level between the singlet state and the triplet state of the localized state is 1.2 eV, which is calculated by using Gaussian 03/TD-DFT)

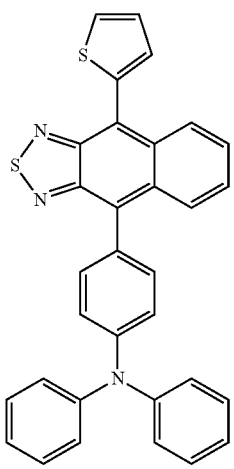 [SMILES: c1ccc(N(c2ccccc2)c2ccc(-c3c4ccccc4c(-c4cccs4)c4nsnc34)cc2)cc1]

3-5 ($\Delta E_{ST}$ of the CT state is 0.01, and meanwhile the difference in energy level between the singlet state and the triplet state of the localized state is 1.4 eV, which is calculated by using Gaussian 03/TD-DFT)

3-6

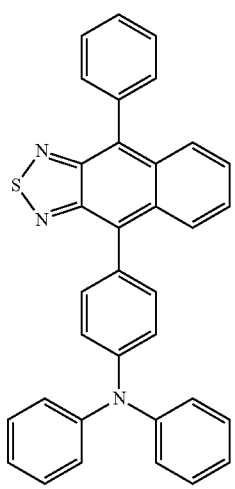

(AFM, DOI: 10.1002/adfm.201301750)

Synthesis of Related Compounds in the Application:

1. Synthesis of Compound 1-7

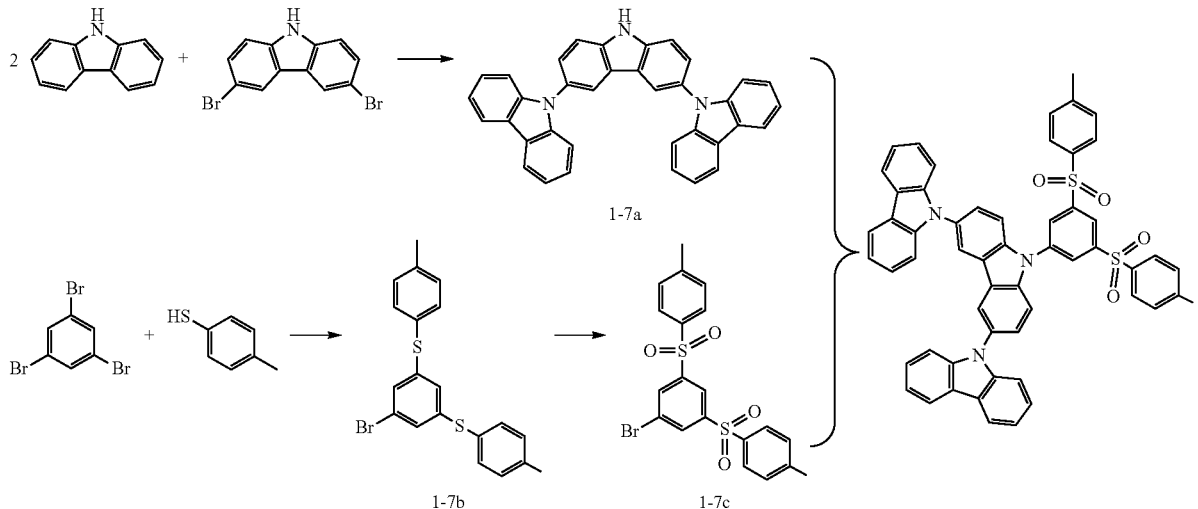

Synthesis of 1-7a 3.34 g of carbazole, 3.22 g of 3,6-dibromocarbazole, 0.5 g of CuI, 0.5 g of phenanthroline and 5.2 g of potassium carbonate were added into a 100-ml round-bottom flask; the mixture was added with 60 ml of DMF, and heated and refluxed under a nitrogen atmosphere for 48 hours; and the reaction solution was poured into water and vacuum filtered to obtain solids. The solids were separated by a chromatographic column to obtain 1-7a. The yield was 30%.

Mass spectrometry data: ESI-MSm/z: 498[M+H]$^+$; elemental analysis: $C_{36}H_{23}N_3$: C, 86.90; H, 4.66; N, 8.44.

Synthesis of 1-7b 3.11 g of tribromobenzene, 2.48 g of methylthiophenol, 6 g of potassium carbonate and 1 g of copper iodide were added into a 100-ml round-bottom flask; the mixture was added with 50 ml of DMF, and heated under a nitrogen atmosphere for 24 hours; and the reaction solution was poured into water and vacuum filtered to obtain solids. The solids were separated by a chromatographic column to obtain 1-7b. The yield was 60%.

Mass spectrometry data: ESI-MSm/z: 401[M+H]$^+$; elemental analysis: $C_{20}H_{17}BrS$: C, 59.85; H, 4.27.

Synthesis of 1-7c

In an ice-water bath, 1-7b, which was dissolved in 30 ml, was slowly added dropwise into 1 g of mCPBA in dichloromethane solution, and completely added in the ice-water bath; and then the mixture was reacted for 12 hours. The solids were separated by a chromatographic column to obtain 1-7c. The yield was 99%.

Mass spectrometry data: ESI-MSm/z: 465[M+H]$^+$; elemental analysis: $C_{20}H_{17}BrO_4S_2$: C, 86.90; H, 4.66; N, 8.44.

Synthesis of 1-7

4.97 g of 1-7a, 4.63 g of 1-7b, 0.5 g of CuI, 0.5 g of phenanthroline and 5.2 g of potassium carbonate were added into a 100-ml round-bottom flask; the mixture was added with 60 ml of DMF, and heated and refluxed under a nitrogen atmosphere for 48 hours; and the reaction solution was poured into water and vacuum filtered to obtain solids. The solids were separated by a chromatographic column to obtain 1-7. The yield was 60%.

Mass spectrometry data: ESI-MSm/z: 882[M+H]$^+$; elemental analysis: $C_{56}H_{39}N_3O_4S_2$: C, 76.25; H, 4.46; N, 4.76.

2. Synthesis of Compound 1-4

The synthesis of 1-4 may be referenced to the synthesis of 1-7, substance test data: mass spectrometry data: ESI-MSm/Z: 717 [M+H]$^+$; elemental analysis: $C_{44}H_{32}N_2O_4S_2$: C, 73.72; H, 4.50; N, 3.91.

3. Synthesis of Compound 1-8

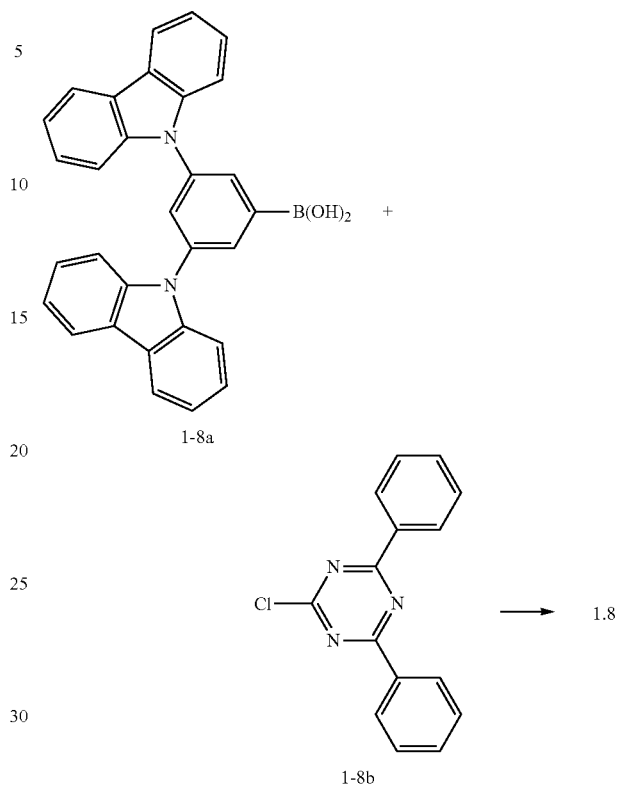

4.52 g of 1-8a, 3 g of 1-8b and 0.05 g of tetrakis(triphenylphosphine)palladium catalyst, as well as 5.4 g of potassium carbonate, were added into a round-bottom flask; and the mixture was added with 30 ml of methylbenzene, 20 ml of water and 5 ml of ethanol, and reacted at 85° C. for 48 hours. The mixture was extracted with dichloromethane at the end of the reaction to obtain an organic layer, and then separated by a chromatographic column to obtain 1-8. The yield was 65%.

Mass spectrometry data: ESI-MSm/z: 640[M+H]$^+$; elemental analysis: $C_{45}H_{29}N_5$: C, 84.48; H, 4.57; N, 10.95.

4. Synthesis of Compound 2-1

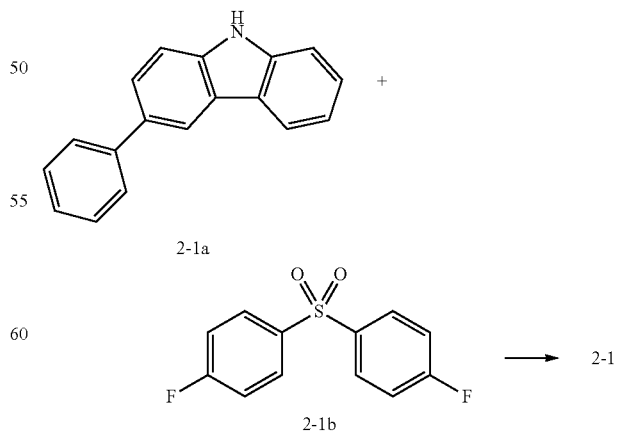

2.43 g of 2-1a was added into 0.24 g of NaH in ultra-dry DMF solution (30 ml); the mixture was stirred at room temperature for 30 minutes; then 2.54 g of 2-1b in DMF solution was added dropwise to this solution, heated to 100° C., and stirred for 1 hour; the mixture was poured into water after being cooled; and solids were filtered and separated by a chromatographic column. 2-1 was obtained.

Mass spectrometry data: ESI-MSm/z: 701[M+H]$^+$; elemental analysis: $C_{48}H_{32}N_2O_2S$: C, 82.26; H, 4.60; N, 4.0.

5. Synthesis of Compound 2-2

The synthesis of compound 2-2 may be referenced to the synthesis of 2-1. The method is basically the same as that of the compound 2-1, and the difference is that 2-1a is replaced by bicarbazolyl.

Mass spectrometry data: ESI-MSm/z: 879 [M+H]$^+$; elemental analysis: $C_{60}H_{38}N_4O_2S$: C, 81.98; H, 4.36; N, 6.37.

6. Synthesis of Compound 2-7

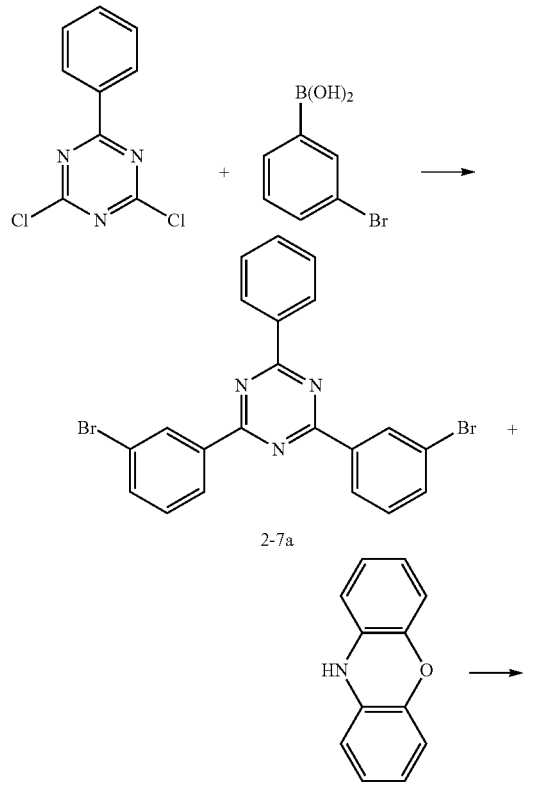

Synthesis of 2-7a 2.25 g of 2,4-dichloro-6-phenyl triazine, 2 g of 3-bromophenylboronic acid and 0.05 g of tetrakis(triphenylphosphine)palladium catalyst, as well as 5.4 g of potassium carbonate, were added into a round-bottom flask; and the mixture was added with 30 ml of methylbenzene, 20 ml of water and 5 ml of ethanol, and reacted at 85° C. for 48 hours. The mixture was extracted with dichloromethane at the end of the reaction to obtain an organic layer, and then separated by a chromatographic column to obtain 2-7a. The yield was 58%.

Mass spectrometry data: ESI-MSm/z: 466 [M+H]$^+$; elemental analysis: $C_{21}H_{13}Br_2N_3$: C, 53.99; H, 2.80; N, 8.99.

Synthesis of 2-7

4.65 g of 2-7a, 3.66 g of phenoxazine, 0.5 g of CuI, 0.5 g of phenanthroline and 5.2 g potassium carbonate were added into a 100-ml round-bottom flask; the mixture was added with 60 ml of DMF, and heated and refluxed under a nitrogen atmosphere for 48 hours; and the reaction solution was poured into water and vacuum filtered to obtain solids. The solids were separated by a chromatographic column to obtain 2-7. The yield was 48%.

Mass spectrometry data: ESI-MSm/z: 672[M+H]$^+$; elemental analysis: $C_{45}H_{29}N_5O_2$: C, 80.46; H, 4.35; N, 4.76.

7. Synthesis of Compound 2-8

Synthesis of 2-8a 2.25 g of 2,4-dichloro-6-phenyl triazine, 2 g of 4-bromophenylboronic acid and 0.05 g of tetrakis(triphenylphosphine)palladium catalyst, as well as 5.4 g of potassium carbonate, were added into a round-bottom flask; and the mixture was added with 30 ml of methylbenzene, 20 ml of water and 5 ml of ethanol, and reacted at 85° C. for 48 hours. The mixture was extracted with dichloromethane at the end of the reaction to obtain an organic layer, and then separated by a chromatographic column to obtain 2-8a. The yield was 55%.

Mass spectrometry data: ESI-MSm/z: 466[M+H]$^+$; elemental analysis: $C_{21}H_{13}Br_2N_3$: C, 53.99; H, 2.80; N, 8.99.

Synthesis of 2-8

4.65 g of 2-8a, 3.66 g of phenoxazine, 0.5 g of CuI, 0.5 g of phenanthroline and 5.2 g potassium carbonate were added into a 100-ml round-bottom flask; the mixture was added with 60 ml of DMF, and heated and refluxed under a nitrogen atmosphere for 48 hours; and the reaction solution was poured into water and vacuum filtered to obtain solids. The solids were separated by a chromatographic column to obtain 2-8. The yield was 56%.

Mass spectrometry data: ESI-MSm/z: 640[M+H]$^+$; elemental analysis: $C_{45}H_{29}N_5$: C, 84.48; H, 4.57; N, 10.95.

8. Synthesis of Compound 2-9

The synthesis of 2-9 may be referenced to the synthesis of 2-7, and the difference is that different donor groups were used, and the phenoxazine was replaced by carbazole. 4.65 g of 2-8a, 3.0 g of carbazole, 0.5 g of CuI, 0.5 g of phenanthroline and 5.2 g potassium carbonate were added into a 100-ml round-bottom flask; the mixture was added with 60 ml of DMF, and heated and refluxed under a nitrogen atmosphere for 48 hours; and the reaction solution was poured into water and vacuum filtered to obtain solids. The solids were separated by a chromatographic column to obtain 2-9. The yield was 50%.

Mass spectrometry data: ESI-MSm/z: 640[M+H]$^+$; elemental analysis: $C_{45}H_{29}N_5$: C, 84.48; H, 4.57; N, 10.95.

9. Synthesis of Compound 2-11

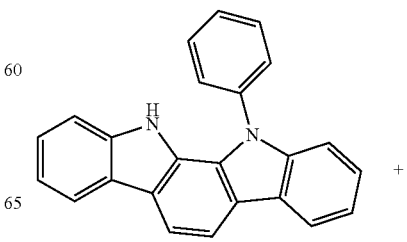

-continued

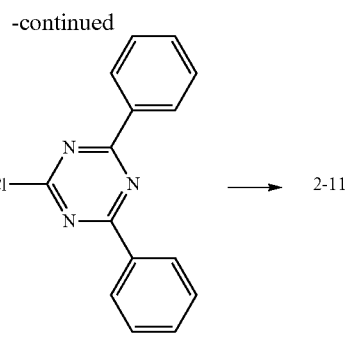

2-11

Synthesis of 2-11

3.32 g of phenylindole carbazole, 2.67 g of 2-chloro-4,6-diphenyl triazine, 0.5 g of CuI, 0.5 g of phenanthroline and 5.2 g of potassium carbonate were added into a 100-ml round-bottom flask; the mixture was added with 60 ml of DMF, and heated and refluxed under a nitrogen atmosphere for 48 hours; and the reaction solution was poured into water and vacuum filtered to obtain solids. The solids were separated by a chromatographic column to obtain 2-7. The yield was 48%.

Mass spectrometry data: ESI-MSm/z: 564[M+H]$^+$; elemental analysis: $C_{39}H_{25}N_5$: C, 83.10; H, 4.47; N, 12.43.

10. Synthesis of Compound 3-3

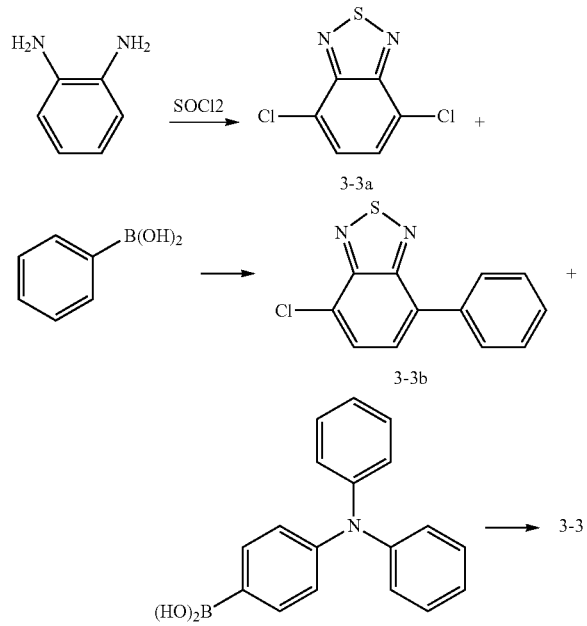

Synthesis of 3-3a 3 ml of pyridine was added to a mixed solution of o-phenylenediamine (0.6 g) and sulfoxide chloride (5 ml), and stirred at 60° C. for 10 hours; and the mixture was extracted with dichloromethane and washed with a great amount of water to obtain solids.

Mass spectrometry data: ESI-MSm/z: 205.

Synthesis of 3-3b 2.25 g of 3-3a, 2 g of phenylboronic acid and 0.05 g of tetrakis(triphenylphosphine)palladium catalyst and 5.4 g of potassium carbonate were added into a round-bottom flask; the mixture was added with 30 ml of methylbenzene, 20 ml of water and 5 ml of ethanol, and reacted at 85° C. for 48 hours. The mixture was extracted with dichloromethane at the end of the reaction to obtain an organic layer, and then separated by a chromatographic column to obtain 3-3a. The yield was 58%.

Mass spectrometry data: ESI-MSm/z: 246[M+H]$^+$

Synthesis of 3-3

2.46 g of 3-3b, 2.39 g of 4-(diphenylamino)phenylboronic acid, 0.05 g of tetrakis(triphenylphosphine)palladium catalyst and 5.4 g of potassium carbonate were added into a round-bottom flask; the mixture was added with 30 ml of methylbenzene, 20 ml of water and 5 ml of ethanol, and reacted at 85° C. for 48 hours; and the mixture was extracted with dichloromethane at the end of the reaction to obtain an organic layer, and then separated by a chromatographic column to obtain 3-3a. The yield was 58%.

Mass spectrometry data: ESI-MSm/z: 456[M+H]$^+$; elemental analysis:

$C_{30}H_{24}N_3S$: C, 79.09; H, 4.65; N, 9.22.

11. Synthesis of Compound 3-4

The synthesis of compound 3-4 may be referenced to the synthesis of compound 3-3. The steps are basically the same, and the difference is that the acceptor groups are thiophene-substituted benzothiazole.

Mass spectrometry data: ESI-MSm/z: 462[M+H]$^+$; elemental analysis: $C_{28}H_{19}N_3S_2$: C, 72.86; H, 4.15; N, 9.10.

12. Synthesis of Compound 3-5

The synthesis of compound 3-5 may be referenced to the synthesis of compound 3-3. The steps are basically the same, and the difference is that the acceptor groups are thiophene-substituted naphthothiazole.

Mass spectrometry data: ESI-MSm/z: 512[M+H]$^+$; elemental analysis: $C_{32}H_{21}N_3S_2$: C, 75.12; H, 4.15; N, 8.21.

Embodiment of the organic light-emitting display device of the present invention: the anode may be inorganic material or organic conducting polymer. The inorganic material is generally metal oxide (for example, indium tin oxide (ITO), zinc oxide (ZnO), indium zinc oxide (IZO) or the like) or metal with a relatively high work function (for example, gold, copper, silver), and is preferably ITO; and the organic conducting polymer is preferably one of polythiophene/polyvinyl benzenesulfonate (hereinafter, PEDOT/PSS for short) and polyaniline (hereinafter, PANI for short).

The cathode is generally metal with a relatively low work function (for example, lithium, magnesium, calcium, strontium, aluminum, indium or the like, or the it alloys with copper, gold, and silver) or an electrode layer alternately formed of metal and metal fluorides. The cathode in the present invention is preferably an LiF layer and an Al layer which are stacked (with the LiF layer being on the outer side).

The hole transport layer may be made from a low-molecular material, for example, arylamines and/or branched polymers, and is preferably NPB.

The fluorescent dye is preferably selected from coumarin compounds (for example, DMQA, C545T) or bipyrane compounds (for example DCJTB, DCM), or the like.

The electron transport layer may be made from an organic metal complex (for example, Alq$_3$, Gaq$_3$, BAlq or Ga(Saph-q)) or other materials commonly used in the electron transport layer, for example aromatic fused ring compounds (for example, pentacene, perylene) or o-phenanthroline compounds (for example, Bphen, BCP).

With regard to the organic electroluminescent device of the present invention, a hole injection layer can also be provided between the anode and the hole transport layer, and the hole injection layer may be made from 4,4',4"-tri(3-methyl phenylaniline) triphenylamine doped with F4TCNQ, or may be CuPc, or may be metal oxides (for example, molybdenum oxide, rhenium oxide).

The thickness of each layer described above may be a common thickness of these layers in the prior art.

Figure 3:
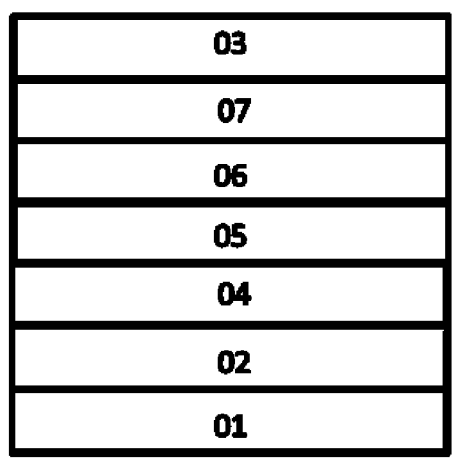
FIG. 3 is a schematic basic structural diagram of an organic electroluminescent device according to the present invention.

The present invention also provides a method for manufacturing the organic electroluminescent device, as shown in FIG. 3, including: successively depositing, on a substrate 01, an anode 02, a hole transport layer 05, a light-emitting layer 06, an electron transport layer 07 and a cathode 03 which are stacked; then packaging the deposition wherein the difference in energy level between the triplet state and the singlet state of the host material in the light-emitting layer 06 is lower than 0.15 eV.

The substrate may be glass or a flexible substrate, and the substrate may be made from a polyester compound material, polyimide compound material or a thin metal sheet. The stacking and the packaging may be performed by any suitable method well known to those skilled in the art.

The present invention will be further described by embodiments.

For the purpose of convenience, the abbreviations and full names of some organic materials involved in this description are all listed below:

| Abbreviation | Full name | Structural formula |
| --- | --- | --- |
| Alq3 | Tris(8-Hydroxyquinoline) aluminum | |
| BAlq | Bis(2-methyl-8-quinolyl)-4-phenyl-phenol aluminum (III) | |
| BCP | 2,9-dimethyl-4,7-diphenyl-1,10-o-phenanthroline | |
| Bphen | 4,7-diphenyl-1,10-o-phenanthroline | |
| C545T | 10-(2-benzothiazole)-1,1,7,7-tetramethyl-2,3,6,7-tetrahydro-1H,5H,11H-benzo[1]pyran[6,7-8-i,j]quinolizin | |

-continued

| Abbreviation | Full name | Structural formula |
|---|---|---|
| CBP | 4,4'-N,N'-dicarbazole-biphenyl | |
| CPF | 9,9-bis(4-dicarbazole-phenyl)fluorene | |
| MTDATA | 4,4',4''-tris(3-methylphenylamine)triphenylamine | m-MTDATA |
| NPB | N,N'-bis-(1-naphthyl)-N,N'-diphenyl-1,1'-biphenyl-4,4'-diamine | NPB |
| PBD | 2-(4-tert-butylphenyl)-5-(4-biphenyl)-1,3,4-oxadiazole | |

-continued

| Abbreviation | Full name | Structural formula |
|---|---|---|
| pentacene | pentacene | |
| TPD | N,N'-diphenyl-N,N'-Bis(3-methylphenyl)-1,1'-biphenyl-4,4'-diamine | |
| perylene | Perylene | |
| DCJTB | 4-4-dicyanomethylene-2-t-butyl-6-(1,1,7,7-tetramethyl-julolidyl-9-enyl)-4H-pyran | |
| DCM | 4-dicyanomethylene-2-methyl-6-(p-dimethylaminostyryl)-4H-pyran | |
| rubrene | 5,6,11,12-tetraphenylnaphthacene | |

-continued

| Abbreviation | Full name | Structural formula |
|---|---|---|
| DCM-1 | — | 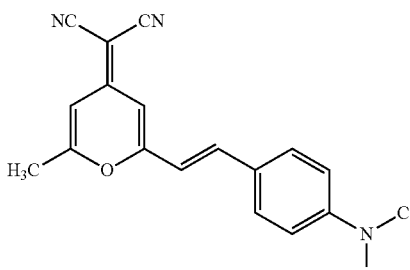 |
| DMQA | | 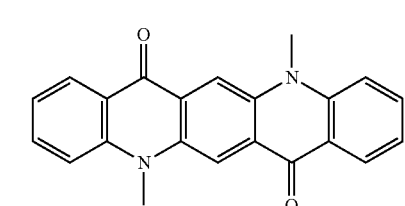 |
| F4TCNQ | | 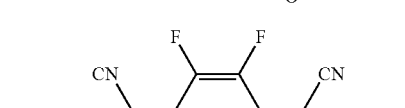 |

In the following embodiments, the light-emitting efficiency of the device is tested by a test device consisting of keithley 2602 and a corrected silicon photodiode. Dividing the brightness obtained by the test device by the current density is the light-emitting efficiency. The luminescence spectrum is tested by Pr655.

Embodiment 1

Yellow light-emitting devices with different doping concentrations of the fluorescent dye are manufactured in this embodiment, and these devices have structures shown in FIG. 3. The light-emitting layer contains one host material (Host1) and one fluorescent dye (YD1) for doping, wherein the Host 1 material is the first type of host material having a first triplet state of the (n-π) excited state thereof slowly lower than that of the CT excited state (0.1 eV), and the singlet state energy level of YD 1 is 2.2 eV, which is lower than that of the Host 1Host1 and YD1 respectively have the following structural formulas:

2-7

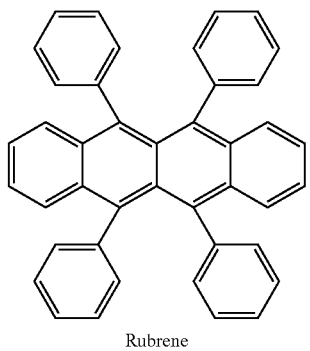

Rubrene

YD 1

The devices of the embodiment have the following structure:

ITO (150 nm)/NPB (40 nm)/Host 1 (0.01%, 0.5%, 1.0%, 5%): YD 1 (30 nm)/Alq$_3$ (20 nm)/LiF (0.5 nm)/Al (150 nm)

wherein the percentages in the brackets before YD 1 represent different doping concentrations of the fluorescent dye; and in this embodiment and the description below, the doping concentration is represented by percentage by weight.

The specific method for manufacturing the organic electroluminescent device is as follows.

First, a glass substrate is cleaned with a detergent and deionized water, and the glass substrate is dried under an infrared lamp; and a layer of anode material is sputtered on the glass, with a film thickness of 150 nm.

Then, the glass substrate with an anode is put in a vacuum chamber, and evacuated to 1×10$^{-4}$ Pa; NPB is continuously evaporated on the anode layer film as a hole transport layer, with a film formation rate of 0.1 nm/s and an evaporated film thickness of 40 nm.

A light-emitting layer is evaporated on the hole transport layer by double-source co-evaporation; and the mass percentages of Host1 and YD1 is controlled by a film thickness monitor by adjusting the film formation rate. The evaporated film thickness is 30 nm.

A layer of $Alq_3$ material is continuously evaporated on the light-emitting layer as an electron transport layer, with an evaporation rate of 0.1 nm/s and an overall evaporated film thickness of 20 nm.

Finally, an LiF layer and an Al layer are successively evaporated on the light-emitting layer as the cathode layer of the device, wherein the evaporation rate of the LiF layer is 0.01 nm/s to 0.02 nm/s and the thickness is 0.5 nm, and the evaporation rate of the Al layer is 1.0 nm/s and the thickness is 150 nm.

Comparative Example 1

Organic electroluminescent device are manufactured by the same method as in Embodiment 1, and the devices have the following structure:

ITO (150 nm)/NPB (40 nm)/Host 1 (01%, 0.5%, 1.0%, 5%): YD 1 (30 nm)/$Alq_3$ (20 nm)/LiF (0.5 nm)/Al (150 nm).

That is, the host material in the light-emitting layer of the device is AND without CT state transition.

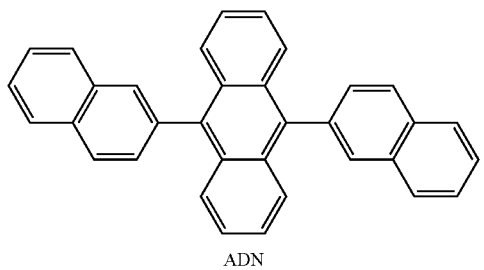 [SMILES: c1ccc2cc(-c3c4ccccc4c(-c4ccc5ccccc5c4)c4ccccc34)ccc2c1]

ADN

Performances of the organic electroluminescent devices of the Embodiment 1 and the Comparative Example 1 are listed in Table 1 below.

TABLE 1

| Device | Composition of the light-emitting layer | Light-emitting efficiency |
|---|---|---|
| Embodiment 1 | Host 1 (2-7): (0.01%) YD 1 (30 nm) | 15.5 |
| | Host 1 (2-7): (0.5%) YD 1 (30 nm) | 20.5 |
| | Host 1 (2-7): (1.0%) YD 1 (30 nm) | 19.5 |
| | Host 1 (2-7): (5.0%) YD 1 (30 nm) | 8.3 |
| Comparative Example 1 | ADN: (0.01%) YD 1 (30 nm) | 4.1 |
| | ADN: (0.5%) YD 1 (30 nm) | 5.2 |
| | ADN: (1.0%) YD 1 (30 nm) | 5.9 |
| | ADN: (5.0%) YD 1 (30 nm) | 4.6 |

It may be seen from Table 1 that, with a same doping concentration of a fluorescent dye, the light-emitting efficiency of the light-emitting devices manufactured by using the first type of host material in which the first triplet state of the (n-π) excited state is slightly lower than that of the CT excited state (0.1 eV) is obviously higher than that of the light-emitting devices manufactured by using host material without the CT state.

In addition, when the doping concentration of the fluorescent dye is between 0.5% and 1%, high light-emitting efficiency may be particularly obtained.

Embodiment 2

Red light-emitting devices with different doping concentrations of fluorescent dyes are manufactured in this embodiment, and these devices have structures shown in FIG. 3. The light-emitting layer contains one host material (Host 2) and one fluorescent doping dye (RD 1), wherein there is a great difference in energy level between the triplet state of the CT excited state and the triplet state of the (n-π) excited state of the Host 2, and the second triplet state of the (n-π) excited state is higher than the first singlet state of the CT state thereof; the singlet state energy lever of RD 1 is 2.0 eV, and the singlet state energy level of RD 1 is lower than that of Host 2. Host 1 and RD 1 have the following structural formulas:

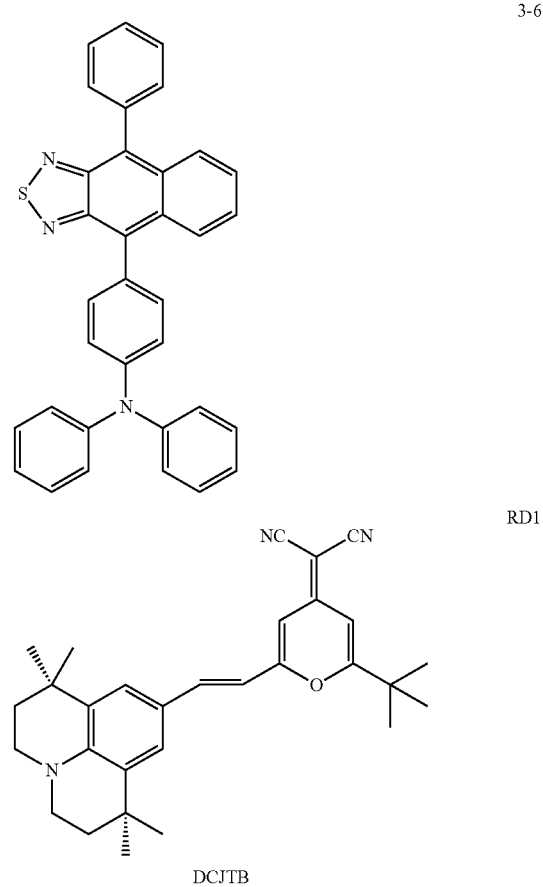

Organic electroluminescent devices are manufactured by the same method as in Embodiment 1, and the devices have the following structure:

ITO (150 nm)/NPB (40 nm)/Host 2 (0.01%, 0.5%, 1.0%, 5%): RD 1 (30 nm)/Bphen (20 nm)/LiF (0.5 nm)/Al (150 nm) wherein the percentages in the baskets before RD 1 represent different doping concentrations of the fluorescent dye.

Comparative Example 2

Organic electroluminescent devices are manufactured by the same method as in Embodiment 1, and the devices have the following structure:

ITO (150 nm) NPB 40 nm)/Alq$_3$: (0.01%, 0.5%, 1.0%, 5%, 10%) RD 1 (30 nm)/Bphen (20 nm)/LiF (0.5 nm)/Al (150 nm).

That is, Alq$_3$ is used as the host material of the light-emitting layer, without CT state transition.

Performances of the organic electroluminescent devices of the embodiments and the Comparative Example 2 are listed in Table 2 below.

TABLE 2

| Device | Composition of the light-emitting layer | Light-emitting efficiency |
| --- | --- | --- |
| Embodiment 2 | Host 2 (3-6): (0.01%) RD 1 (30 nm) | 5.0 |
|  | Host 2 (3-6): (0.5%) RD 1 (30 nm) | 6.6 |
|  | Host 2 (3-6): (1.0%) RD 1 (30 nm) | 5.9 |
|  | Host 2 (3-6): (5.0%) RD 1 (30 nm) | 4.2 |
|  | Host 2 (3-6): (10.0%) RD 1 (30 nm) | 2.1 |
| Comparative Example 2 | Alq$_3$: (0.01%) RD 1 (30 nm) | 0.4 |
|  | Alq$_3$: (0.5%) RD 1 (30 nm) | 2.2 |
|  | Alq$_3$: (1.0%) RD 1 (30 nm) | 2.3 |
|  | Alq$_3$: (5.0%) RD 1 (30 nm) | 1.2 |
|  | Alq$_3$: (10.0%) RD 1 (30 nm) | 0.7 |

It may be seen from Table 2 that with a same doping concentration, the light-emitting efficiency of the light-emitting devices manufactured by using manufactured by adopting host material in which there is a great difference (1.3 eV) in the energy level (1.3 eV) between the triplet state of the CT excited state and the triplet state of the (n-π) exited state and the second triplet state of the (n-π) excited state is higher than the first singlet state of the CT excited state thereof, is obviously higher than that of the by adopting organic electroluminescent devices using the common host material. In addition, when the doping concentration of the fluorescent dye is between 0.01% and 1%, particularly, a high light-emitting efficiency may be particularly obtained.

Embodiment 3

In order to test then influence of the host material of the present invention on the performance of the electroluminescent devices, in this embodiment, organic electroluminescent devices are manufactured by the same method as in Embodiment 1, and the light-emitting devices have the following structure:

ITO (150 nm)/NPB (40 nm)/host material: 0.5% YD 1 (30 nm)/Bphen (20 nm)/LiF (0.5 nm)/Al (150 nm).

Performances of the organic electroluminescent devices are represented in Table 3 below.

TABLE 3

| | Structure of the light-emitting layer | Current efficiency cd/A |
| --- | --- | --- |
| OLED 3 | 1-1: (0.5%) YD 1 (30 nm) | 20 |
| OLED 4 | 1-2: (0.5%) YD 1 (30 nm) | 24 |
| OLED 5 | 1-3: (0.5%) YD 1 (30 nm) | 30 |
| OLED 6 | 1-4: (0.5%) YD 1 (30 nm) | 24 |
| OLED 7 | 1-5: (0.5%) YD 1 (30 nm) | 34 |
| OLED 8 | 1-6: (0.5%) YD 1 (30 nm) | 36 |
| OLED 9 | 1-7: (0.5%) YD 1 (30 nm) | 28 |
| OLED 10 | 1-8: (0.5%) YD 1 (30 nm) | 31 |
| OLED 11 | 1-9: (0.5%) YD 1 (30 nm) | 29 |
| OLED 12 | 1-10: (0.5%) YD 1 (30 nm) | 19 |
| OLED 13 | 1-11: (0.5%) YD 1 (30 nm) | 17 |
| OLED 14 | 1-12: (0.5%) YD 1 (30 nm) | 23 |
| OLED 15 | 2-1: (0.5%) YD 1 (30 nm) | 19 |
| OLED 16 | 2-2: (0.5%) YD 1 (30 nm) | 36 |
| OLED 17 | 2-3: (0.5%) YD 1 (30 nm) | 28 |
| OLED 18 | 2-4: (0.5%) YD 1 (30 nm) | 24 |
| OLED 19 | 2-5: (0.5%) YD 1 (30 nm) | 35 |
| OLED 20 | 2-6: (0.5%) YD 1 (30 nm) | 12 |
| OLED 21 | 2-7: (0.5%) YD 1 (30 nm) | 20.5 |
| OLED 22 | 2-8: (0.5%) YD 1 (30 nm) | 33 |
| OLED 23 | 2-9: (0.5%) YD 1 (30 nm) | 32 |
| OLED 24 | 2-10: (0.5%) YD 1 (30 nm) | 27 |
| OLED 25 | 2-11: (0.5%) YD 1 (30 nm) | 25 |
| OLED 26 | 2-12: (0.5%) YD 1 (30 nm) | 36 |
| OLED 27 | 2-13: (0.5%) YD 1 (30 nm) | 35 |
| OLED 28 | 2-14: (0.5%) YD 1 (30 nm) | 35 |
| OLED 29 | 2-15: (0.5%) YD 1 (30 nm) | 31 |
| OLED 30 | 3-1: (0.5%) YD 1 (30 nm) | 23 |
| OLED 31 | 3-2: (0.5%) YD 1 (30 nm) | 21 |
| OLED 32 | 3-3: (0.5%) YD 1 (30 nm) | 25 |
| OLED 33 | 3-4: (0.5%) YD 1 (30 nm) | 16 |
| OLED 34 | 3-5: (0.5%) YD 1 (30 nm) | 14 |
| OLED 35 | 3-6: (0.5%) YD 1 (30 nm) | 11 |

The aforementioned embodiments are merely preferred embodiments exemplified for fully describing the present invention and the protection scope of the present invention is not limited thereto. Equivalent replacements or changes made on the basis of the present invention by those skilled in the prior art are included in the protection scope of the present invention. The protection scope of the present invention is subject to the appended claims.

What is claimed is:

1. An organic electroluminescent device, comprising an anode, a hole transport layer, a light-emitting layer, an electron transport layer and a cathode which are stacked, the light-emitting layer comprising a host material and a luminescent dye, wherein the host material of the light-emitting layer is a material in which the triplet state energy level in CT excited state is higher than that in the n-π excited state by 0 to 0.3 eV; or the host material of the light-emitting layer is a material in which the triplet state energy level in CT excited state is higher than that in an n-π excited state by more than 1.0 eV, and the difference between the second triplet state energy level in the n-π excited state of the host material and a first singlet state energy level in the CT excited state is −0.1 to 0.1 eV; and the luminescent dye is a fluorescent dye;

wherein the host material has at least one of the following structures:

1-3

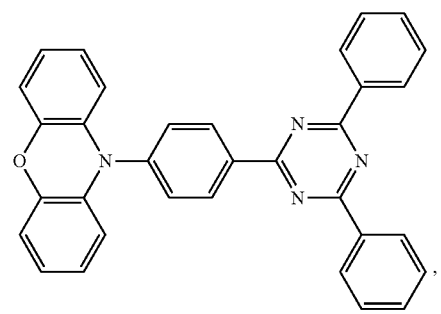

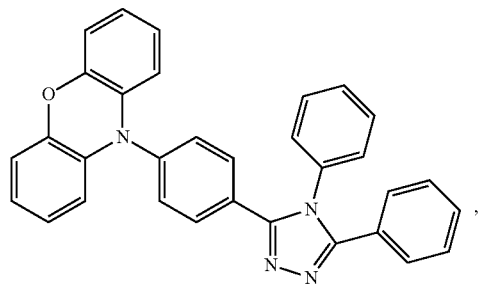
1-5
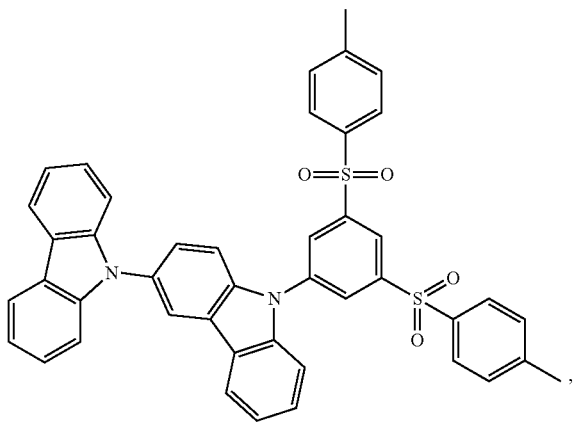
1-8
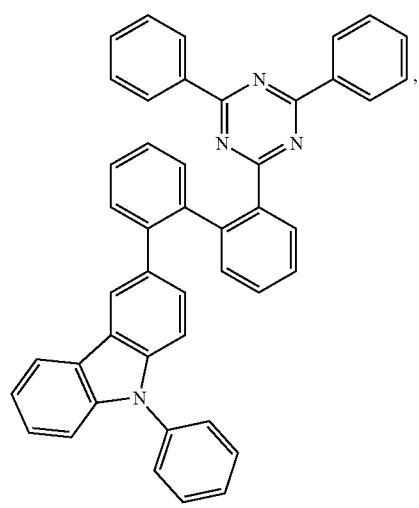
1-6
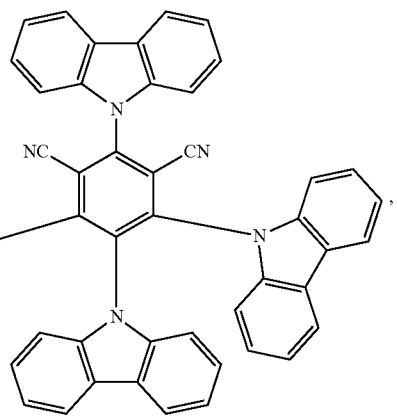
1-9
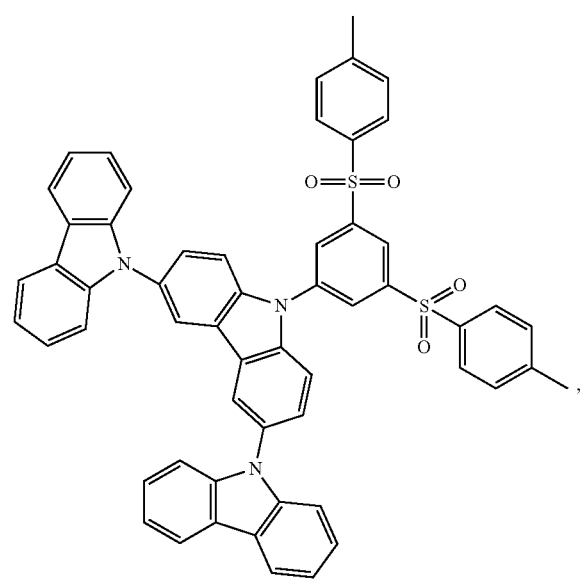
1-7
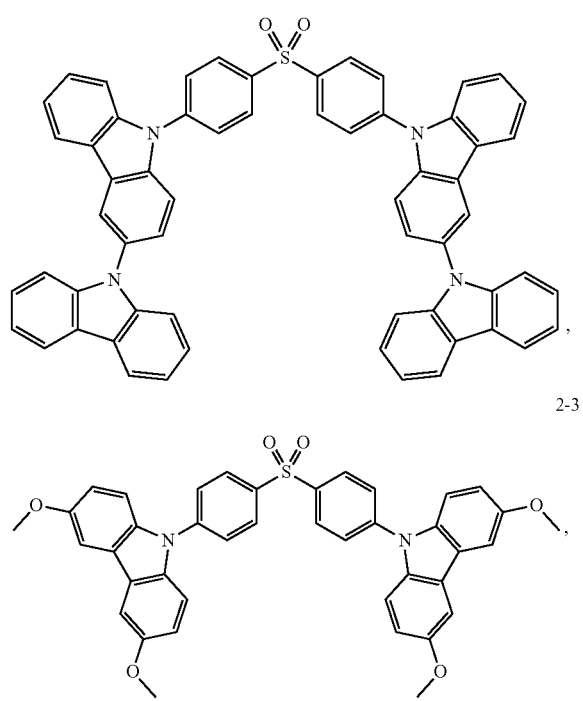
2-2
2-3

2-5
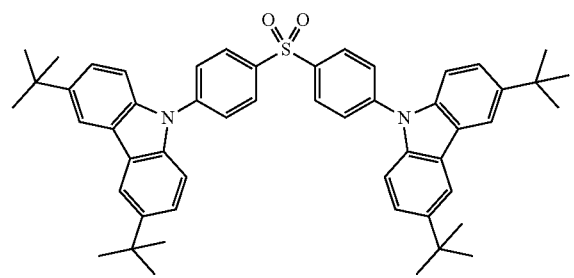
2-8
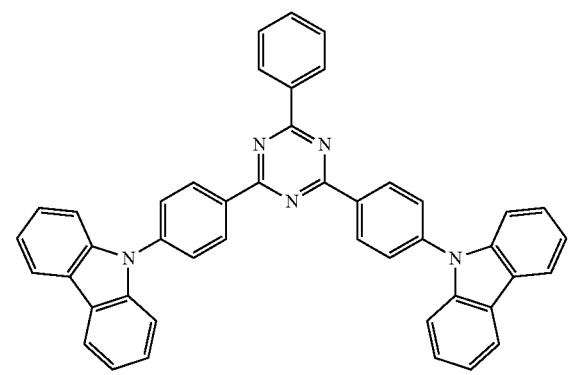
2-9
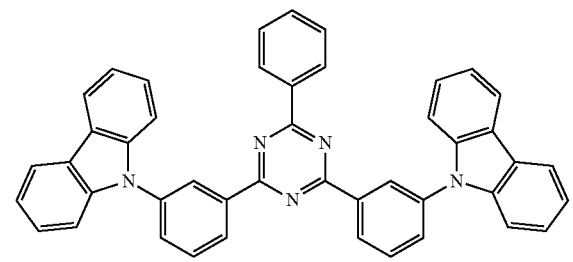
2-10
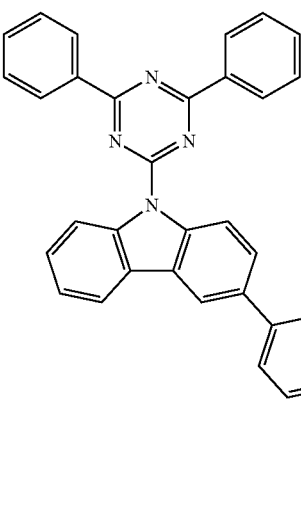
2-12
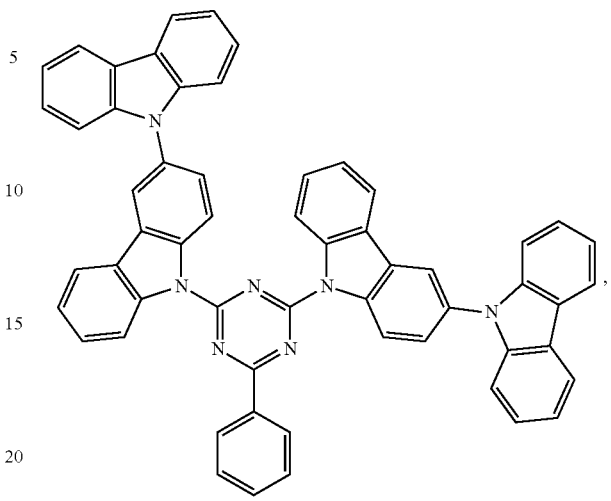
2-13
2-14
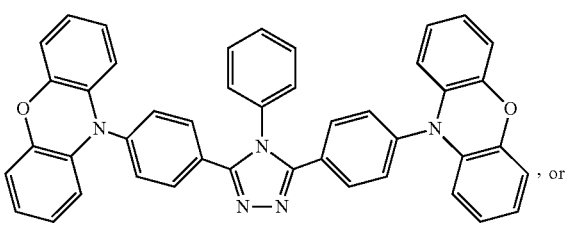
2-15
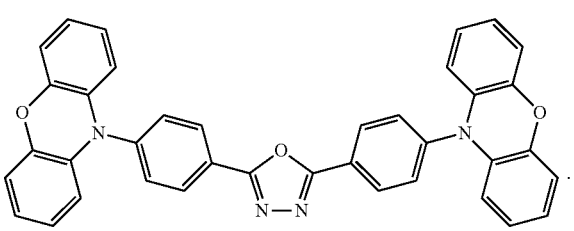
2. The organic electroluminescent device according to claim 1, characterized in that the singlet state energy level of the fluorescent dye is lower than that of the host material.

3. The organic electroluminescent device according to claim 1, characterized in that the luminescent dye is a fluorescent dye with triplet state energy level lower than 2.3 eV.

4. The organic electroluminescent device according to claim 3, characterized in that the doping concentration of the fluorescent dye in the light-emitting layer is not greater than 5% by weight.

5. The organic electroluminescent device according to claim 4, characterized in that the doping concentration of the fluorescent dye in the light-emitting layer is 0.001% to 1% by weight.

6. The organic electroluminescent device according to claim 4, characterized in that the doping concentration of the fluorescent dye in the light-emitting layer is 0.1% to 1% by weight.

7. The organic electroluminescent device according to claim 1, characterized in that the triplet state energy level of the material of the hole transport layer is higher than that of the host material.

8. The organic electroluminescent device according to claim 1, characterized in that the triplet state energy level of the material of the hole transport layer is higher than 2.5 eV.

9. The organic electroluminescent device according to claim 1, characterized in that the triplet state energy level of the material of the electron transport layer is higher than 2.5 eV.

10. The organic electroluminescent device according to claim 1, characterized in that a hole injection layer is provided between the anode and the hole transport layer.

11. A method for preparing the organic electroluminescent device according to claim 1, comprising: successively depositing an anode, a hole transport layer, a light-emitting layer, an electron transport layer and a cathode on a substrate, which are stacked; and then packaging.

* * * * *